(12) United States Patent
Härle et al.

(10) Patent No.: US 8,258,521 B2
(45) Date of Patent: Sep. 4, 2012

(54) RADIATION-EMITTING SEMICONDUCTOR BODY WITH CARRIER SUBSTRATE AND METHOD FOR THE PRODUCTION THEREOF

(75) Inventors: Volker Härle, Laaber (DE); Zeljko Spika, Regensburg (DE)

(73) Assignee: OSRAM Opto Semiconductor GmbH, Regensburg (DE)

(*) Notice: Subject to any disclaimer, the term of this patent is extended or adjusted under 35 U.S.C. 154(b) by 0 days.

(21) Appl. No.: 13/085,976

(22) Filed: Apr. 13, 2011

(65) Prior Publication Data

US 2011/0186904 A1 Aug. 4, 2011

Related U.S. Application Data

(63) Continuation of application No. 12/299,446, filed as application No. PCT/DE2007/000793 on May 3, 2007, now Pat. No. 8,088,649.

(30) Foreign Application Priority Data

May 3, 2006 (DE) .......................... 10 2006 020 537
Jul. 19, 2006 (DE) .......................... 10 2006 033 502

(51) Int. Cl.
H01L 29/267 (2006.01)
H01L 31/00 (2006.01)
(52) U.S. Cl. .................................... 257/81; 257/E23.06
(58) Field of Classification Search ........ 257/8, E23.061
See application file for complete search history.

(56) References Cited

U.S. PATENT DOCUMENTS

| 4,910,534 A | 3/1990 | Kim |
| 5,684,309 A | 11/1997 | McIntosh et al. |
| 5,831,277 A | 11/1998 | Razeghi |
| 6,172,382 B1 | 1/2001 | Nagahama et al. |
| 6,559,075 B1 | 5/2003 | Kelly et al. |
| 6,849,881 B1 | 2/2005 | Harle et al. |
| 7,180,235 B2 | 2/2007 | Gotoh et al. |
| 2003/0189215 A1 | 10/2003 | Lee et al. |
| 2004/0001243 A1 | 1/2004 | Takagi |
| 2005/0082643 A1 | 4/2005 | Kondo |
| 2006/0035444 A1 | 2/2006 | Nakamura et al. |

FOREIGN PATENT DOCUMENTS

| CN | 15 96040 | 3/2005 |
| DE | 199 00 335 | 12/1999 |
| DE | 100 17 337 | 10/2001 |
| DE | 103 39 985 | 3/2005 |
| EP | 0 790 132 | 8/1997 |
| EP | 1 333 485 | 1/2003 |
| EP | 1 577 958 | 3/2005 |
| JP | 11-177139 | 7/1999 |

(Continued)

*Primary Examiner* — William D Coleman
(74) *Attorney, Agent, or Firm* — Cozen O'Connor

(57) ABSTRACT

A radiation-emitting semiconductor body with a carrier substrate. A structured connection is produced between a semiconductor layer sequence (2) and a carrier substrate wafer (1). The semiconductor layer sequence is subdivided into a plurality of semiconductor layer stacks (200) by means of cuts (6) through the semiconductor layer sequence, and the carrier substrate wafer (1) is subdivided into a plurality of carrier substrates (100) by means of cuts (7) through the carrier substrate wafer (1). In the method, the structured connection is formed in such a way that at least one semiconductor layer stack (200) is connected to one and only one associated carrier substrate (100). In addition, at least one cut (7) through the carrier substrate wafer is not extended by any of the cuts (6) through the semiconductor layer sequence such that a straight cut results through the carrier substrate wafer and the semiconductor layer sequence.

26 Claims, 10 Drawing Sheets

FOREIGN PATENT DOCUMENTS

| | | |
|---|---|---|
| JP | 2003-092450 | 3/2003 |
| JP | 2003-124151 | 4/2003 |
| JP | 2004-37485 | 2/2004 |
| JP | 2005-86166 | 3/2005 |
| TW | 232604 | 5/2005 |
| TW | 235511 | 7/2005 |
| TW | 251355 | 3/2006 |
| TW | 251357 | 3/2006 |
| WO | WO 01/39282 | 5/2001 |
| WO | WO 2004/068572 | 8/2004 |

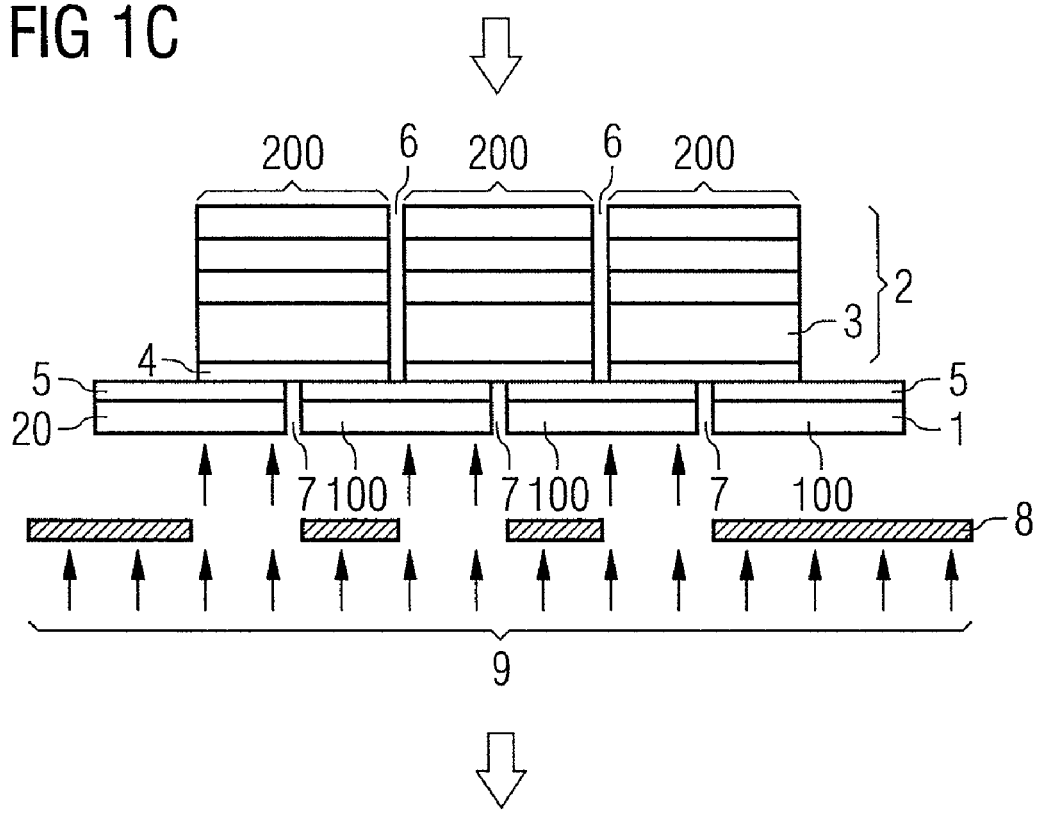
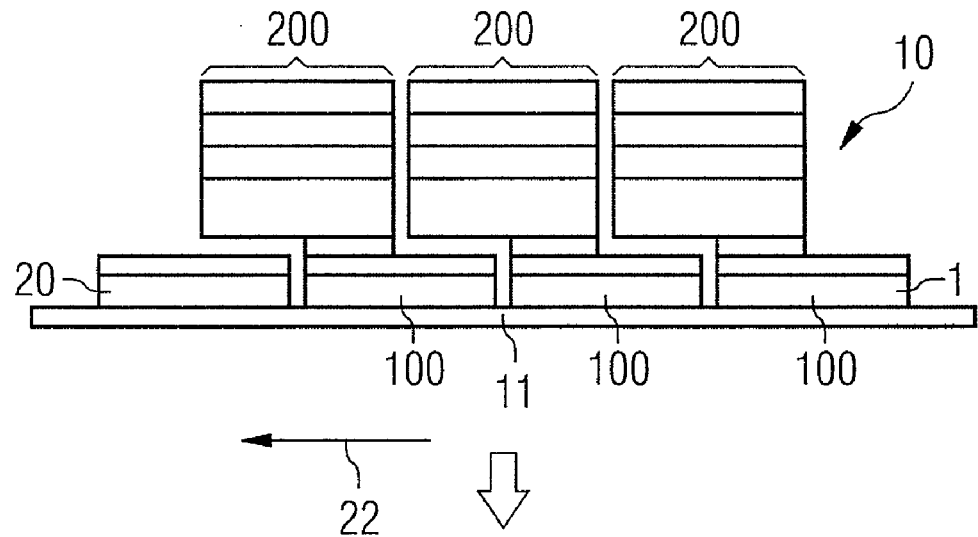

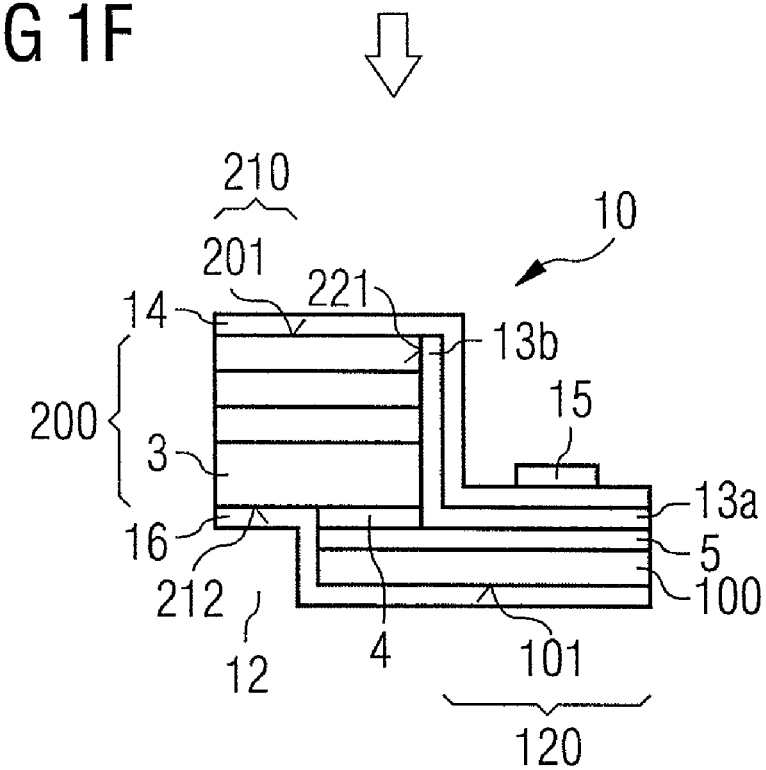
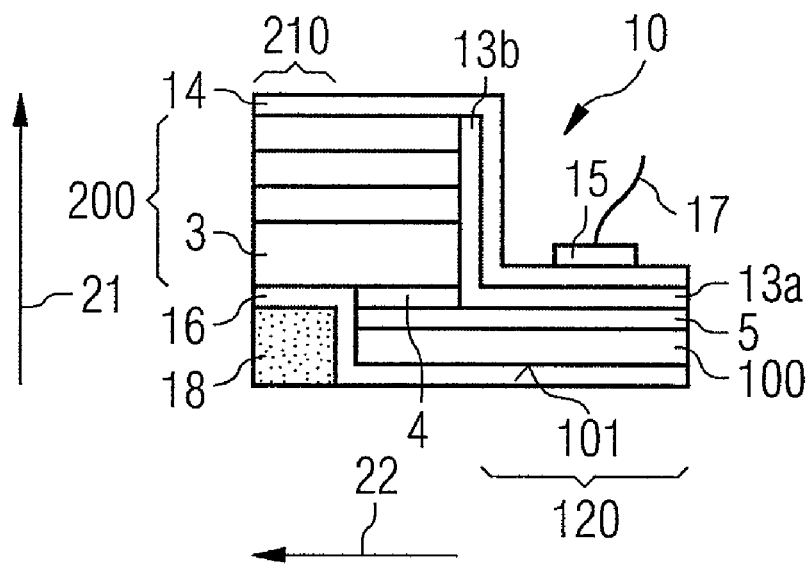

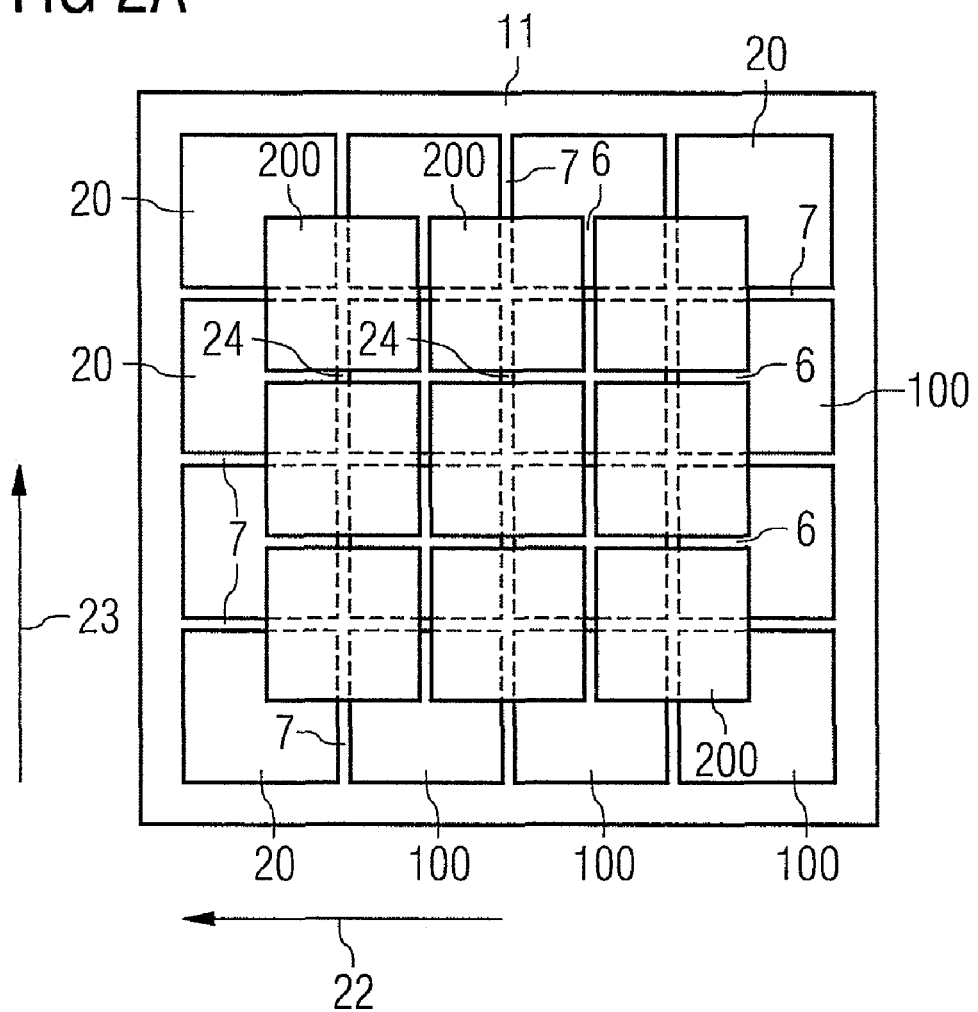

RADIATION-EMITTING SEMICONDUCTOR BODY WITH CARRIER SUBSTRATE AND METHOD FOR THE PRODUCTION THEREOF

RELATED APPLICATIONS

This application is a continuation of application Ser. No. 12/299,446 filed Apr. 29, 2009, which is a U.S. national stage under 35 USC §371 of application No. PCT/DE2007/000793 filed on May 3, 2007, which claims priority of German Application nos. 10 2006 020 537.5 filed May 3, 2006 and 10 2006 033 502.3 filed Jul. 19, 2006, the entire content of both of which is hereby incorporated by reference.

BACKGROUND OF THE INVENTION

Field of the Invention

The invention relates to a radiation-emitting semiconductor body with a carrier substrate and a method for producing the same.

In conventional methods for producing semiconductor bodies with a carrier substrate, a carrier substrate wafer and a semiconductor layer sequence are connected to one another over the entire area. Subdivision into individual semiconductor bodies is then possible only by cuts through the semiconductor layer sequence and through the carrier substrate wafer, which cuts run such that the cuts through the semiconductor layer sequence and through the carrier substrate wafer which bound the semiconductor body on one side each lie on a common plane or surface, or in other words represent a single cut.

The mutually facing surfaces of the semiconductor layer stack and of the associated carrier substrate then necessarily have the same dimensions and are arranged flush. Electrical contact is normally made with semiconductor bodies such as these by a bond pad which is arranged on the radiation output surface.

In order to avoid shadowing by the bond pad, for example, it may, however, be desirable for this bond pad not to be arranged on the semiconductor layer stack but on the carrier substrate. For this purpose, for example, semiconductor bodies can be produced in which the semiconductor layer stack does not completely cover the carrier substrate. For example, the document DE 103 39 985 A1 discloses a semiconductor body in which a semiconductor layer stack is arranged on a carrier substrate which has a larger base area than the semiconductor layer stack. Semiconductor bodies such as these cannot be produced in a wafer assembly by conventional methods.

SUMMARY OF THE INVENTION

One object of the present invention is to specify a simplified and cost-effective method for producing radiation-emitting semiconductor bodies with a carrier substrate. A further object of the present invention is to specify a radiation-emitting semiconductor body with a carrier substrate, which semiconductor body has as large a radiation outlet surface as possible, can be produced cost-effectively, and with which contact can be made easily.

These and other objects are attained in accordance with one aspect of the present invention directed to a method for producing a plurality of radiation-emitting semiconductor bodies with a carrier substrate comprises, in particular, the following steps:

provision of a carrier substrate wafer;
production of a semiconductor layer sequence which is suitable for producing electromagnetic radiation;
production of a structured connection of the semiconductor layer sequence to the carrier substrate wafer;
subdivision of the semiconductor layer sequence into a plurality of semiconductor layer stacks by means of cuts through the semiconductor layer sequence;
subdivision of the carrier substrate wafer into a plurality of carrier substrates by means of cuts in the carrier substrate wafer; and
separation of the semiconductor layer stacks with the associated carrier substrates to form individual semiconductor bodies, wherein
the structured connection is formed in such a way that at least one semiconductor layer stack is connected to one and only one associated carrier substrate; and
at least one cut through the carrier substrate wafer is not extended by any of the cuts through the semiconductor layer sequence such that a straight cut results through the carrier substrate wafer and the semiconductor layer sequence.

The semiconductor layer sequence preferably comprises a pn junction, a double-heterostructure, a single quantum well or particularly preferably a multiple quantum well structure (MQW) for radiation generation. The expression quantum well structure in this case does not include any indication of the dimensionality of the quantization. It thus, inter alia, covers quantum troughs, quantum wires and quantum dots, and any combination of these structures. Examples of MQW structures are described in the documents U.S. Pat. No. 6,849,881, U.S. Pat. No. 5,831,277, U.S. Pat. No. 6,172,382 B1 and U.S. Pat. No. 5,684,309, the disclosure content of all of which is hereby incorporated by reference.

The structured connection is preferably designed such that a plurality of semiconductor layer stacks are each connected to one and only one associated carrier substrate. Particularly preferably, each semiconductor layer stack is connected to one and only one associated carrier substrate.

When producing the structured connection, the semiconductor layer sequence need not be directly adjacent to the carrier substrate wafer. In fact, one or more further layers, for example a connection layer, may be arranged between the semiconductor layer sequence and the carrier substrate wafer.

The method makes use of the idea that a structured connection can be produced between a semiconductor layer sequence and a carrier substrate wafer. The assembly which comprises the semiconductor layer sequence and the carrier substrate wafer is then structured to form individual semiconductor bodies, which each comprise a semiconductor layer stack and a carrier substrate. This can be done, for example, by cuts through the semiconductor layer sequence and by cuts through the carrier substrate wafer.

The production of a structured connection between the semiconductor layer sequence and the carrier substrate wafer advantageously allows cuts to be made through the semiconductor layer sequence and through the carrier substrate wafer offset with respect to one another. In other words, the projection of at least one cut through the carrier substrate wafer in the connection plane does not completely contain the projection of any of the cuts through the semiconductor layer sequence into this plane.

The connection plane is in this case that plane which contains the connection surface or a surface of the connection layer.

Cuts through the semiconductor layer sequence do not need to cut through the carrier substrate wafer. Equally, cuts through the carrier substrate wafer do not need to cut through the semiconductor layer sequence. Nevertheless, these cuts produce individual semiconductor bodies in which the semiconductor layer stack and the associated carrier substrate are advantageously not arranged flush with respect to one another. Rather, semiconductor bodies with a semiconductor layer stack and a carrier substrate can be produced in a wafer assembly, in which semiconductor bodies the semiconductor layer stack does not cover a connecting region of the carrier substrate in a plan view of the front side, facing away from the carrier substrate, of the semiconductor layer stack, and/or in which the carrier substrate does not cover a first subregion of the semiconductor layer stack in a plan view of that side of the carrier substrate which faces away from the semiconductor layer stack.

In this case, virtually the entire semiconductor layer sequence is used to produce semiconductor layer stacks. Apart from the loss resulting from the cuts and possibly from an edge of the semiconductor layer sequence which may be lost because of the geometric conditions—for example when producing semiconductor bodies with a rectangular base area from a semiconductor layer sequence with a circular base area—no material is preferably lost from the semiconductor layer sequence.

Furthermore, the number of process steps and adjustment steps for producing a plurality of semiconductor bodies in which a connecting region of the carrier substrate is not covered by the semiconductor layer sequence is particularly small.

There is preferably at least one offset direction, which is contained on the connection plane, for at least one semiconductor body, but preferably for a plurality of semiconductor bodies, and particularly preferably for all the semiconductor bodies which are produced by the method. In the offset direction, adjacent cuts through the semiconductor layer sequence and through the carrier substrate wafer are offset with respect to one another. The side surfaces which are produced by the cuts and bound a semiconductor layer stack and the associated carrier substrate along this direction when seen in a plan view are then shifted with respect to one another in the offset direction. The projections of the offset cuts or side surfaces into the connection plane then do not touch or intersect. The offset direction is parallel to the distance vector between the projections.

Alternatively or additionally, adjacent cuts through the semiconductor layer sequence and through the carrier substrate wafer may be formed differently. For example, they may be curved differently and/or at least one of the cuts can be passed over a corner. In this case, it is possible for the side surfaces of the semiconductor layer stack and of the associated carrier substrate of a semiconductor body which is bounded by these cuts to be shifted with respect to one another in some places, and to be flush in some places.

In general, the growth of the semiconductor layer sequence takes place along the surface normal of the connection plane, which surface normal points towards the front side, facing away from the carrier substrate, of the semiconductor layer sequence. This surface normal is referred to as the "growth direction". However, for example because of certain process conditions, minor discrepancies can occur from the direction which is referred to as the growth direction, or fluctuations can occur in the direction of the actual layer growth.

Normally, the growth direction also corresponds to the main emission direction of the semiconductor bodies. However, it is also possible for the semiconductor layer sequence to be connected to the carrier substrate wafer such that the direction of the actual layer growth runs in the opposite direction to the direction which is referred to as the "growth direction" and is predetermined by the surface normal of the connection plane, which surface normal points towards the front side, facing away from the carrier substrate, of the semiconductor layer sequence. Particularly in this situation, it is also possible to provide for the radiation which is produced by the semiconductor bodies during operation to be output through the carrier substrate wafer.

The cuts are expediently positioned such that the semiconductor body has a step which is formed by the semiconductor layer stack and the carrier substrate. The semiconductor layer stack therefore covers the side facing it of a first region of the carrier substrate, while the surface facing the semiconductor layer stack of a connecting region of the carrier substrate is free of the semiconductor layer stack.

If there are at least two pairs of offset cuts through the semiconductor layer sequence and in the carrier substrate, then the semiconductor layer sequence of at least one semiconductor body, preferably of a plurality of semiconductor bodies, but particularly preferably of all the semiconductor bodies, may have a first subregion which projects beyond the edge of the carrier substrate, essentially parallel to the connection plane.

The semiconductor body then has a second step which is formed by the semiconductor layer sequence and the carrier substrate in such a way that the first subregion of the semiconductor layer stack represents an overhang, which is located alongside the carrier substrate in an offset direction.

The assembly comprising the semiconductor layer sequence and the carrier substrate wafer is, in other words, subdivided by at least one pair of mutually offset cuts, which are positioned, preferably along and in the opposite direction to the growth direction, on the one hand, from the side of the semiconductor layer sequence facing away from the carrier substrate wafer and on the other hand from the side of the carrier substrate wafer facing away from the semiconductor layer sequence. Only together with a region on the connection plane which is left free of the structured connection, at least one continuous "cut" is thus created, which "cut" first cuts through the carrier substrate wafer, seen from the side of the carrier substrate wafer facing away from the semiconductor layer sequence, then bends and subsequently runs parallel to the connection plane, preferably along an offset direction, before it bends once again, and cuts through the semiconductor layer sequence, preferably in the growth direction.

If, for example, there is only one offset direction, then cuts through the semiconductor layer sequence and in the carrier substrate which run parallel to the offset direction can be arranged in a common plane such that they together form a continuous straight cut through the semiconductor layer sequence and the carrier substrate wafer.

Cuts through the semiconductor layer sequence and through the carrier substrate wafer which do not run parallel to the offset direction may, for example, be offset with respect to one another and/or may have different curvatures in such a way that, for at least one semiconductor body, the semiconductor layer stack does not cover a connecting region of the associated carrier substrate and preferably has a first subregion which projects beyond the edge of the carrier substrate along this direction. Particularly preferably, these cuts run at right angles to the offset direction.

However, it is also possible for there to be a first and a second offset direction, both of which lie on the connection plane and which are preferably at right angles to one another. In general, at least one pair of cuts through the semiconductor layer sequence and through the carrier substrate wafer are then offset with respect to one another in the first offset direction, and at least one further pair of cuts through the semiconductor layer sequence and through the carrier substrate wafer are offset in the second offset direction with respect to one another. In this case, for at least one semiconductor body, the semiconductor layer stack is shifted with respect to the associated carrier substrate in the first and in the second offset direction. The cuts are preferably made such that none of the cuts through the semiconductor layer sequence is contained completely in one of the regions which are defined by the imaginary continuation of a cut in the carrier substrate as far as the front side of the semiconductor layer sequence.

In one particularly preferred embodiment, there are a plurality of cuts in the carrier substrate and through the semiconductor layer sequence, which run parallel to one another, and there are a second plurality of cuts in the carrier substrate and through the semiconductor layer sequence which run parallel to one another and at right angles to the first plurality of cuts.

The one, a plurality of or all the further layers are also preferably subdivided, if appropriate, by the cuts through the semiconductor layer sequence and/or through the carrier substrate wafer.

However, cuts through the semiconductor layer sequence do not cut through the carrier substrate wafer, and cuts through the carrier substrate wafer do not cut through the semiconductor layer sequence, unless they together form a straight continuous cut.

The cuts through the carrier substrate wafer and/or through the semiconductor layer sequence are preferably produced by means of sawing and/or by means of other suitable mechanical (for example milling) or chemical (for example dry etching) processes that remove material. In one alternative expedient refinement of the method, the cuts are produced by means of a laser process which removes material.

In the present context, the expression "cut" covers all trenches which are produced before or after the connection of the semiconductor layer sequence and which at least partially cut through the semiconductor layer sequence or the carrier substrate wafer and thus—possibly together with regions on the connection plane which are not connected by the structured connection—subdivide it into semiconductor layer stacks or carrier substrates, respectively.

In one preferred embodiment of the method, the production of the structured connection initially comprises connection of the semiconductor layer sequence to the carrier substrate wafer over the entire area. The connection over the entire area is then detached in places, again.

According to one advantageous refinement of this embodiment a sacrificial layer is produced. The sacrificial layer is preferably adjacent to the connection layer or connection surface by means of which the connection over the entire area is produced. Detaching the connection in places between the carrier substrate wafer and the semiconductor layer sequence is preferably carried out by damaging or destroying the sacrificial layer in places. A layer which is primarily used for a different purpose may also be suitable for use as a sacrificial layer and may be identified and used as such.

The connection is preferably detached in places by means of laser radiation. In this case, the sacrificial layer is expediently irradiated with laser radiation through the carrier substrate wafer. Suitable materials for a sacrificial layer in this case preferably have a suitable, in particular low, band gap and/or low chemical stability and comprise, for example GaN, InGaN or other nitride compound semiconductor materials.

A method for separating two material layers over the entire area by means of irradiation with electromagnetic radiation is disclosed, for example, in the document U.S. Pat. No. 6,559,075, the disclosure content of which is hereby incorporated herein by reference.

In the present context, the irradiation is primarily carried out essentially in those places at which the connection is intended to be detached.

For example, this is achieved by irradiation through a mask. In this case, the mask does not need to be connected to the carrier substrate wafer. However, it can alternatively also be applied to the carrier substrate wafer. The mask is irradiated over its area or sequentially, for example by a linear radiation source being moved relative to it.

One alternative to irradiation through a mask is to use at least one laser beam with a sufficiently small beam cross section, which is moved relative to the carrier substrate and in the process disintegrates the sacrificial layer in a manner corresponding to the desired structure and in this way produces the regions of the semiconductor layer sequence which are not connected to the carrier substrate.

In an alternative embodiment of the method according to the invention, no connection over the entire area is produced from the start between the semiconductor layer sequence and the carrier substrate wafer. Rather, the semiconductor layer sequence and the carrier substrate wafer are being connected to one another only in places, primarily only in those regions in which the semiconductor layer stack and the carrier substrate overlap in the future semiconductor bodies.

The connection over the entire area or in places between the carrier substrate wafer and the semiconductor layer sequence can be produced, for example, by means of a connection layer. This may be formed on the carrier substrate wafer or on the semiconductor layer sequence.

By way of example, the connection layer has a solder layer which, in particular, comprises a solder metal such as Au, AuSn, Pd, In and/or Pt or consists of such a solder metal. Alternatively or additionally, an adhesive layer is also feasible for use as the connection layer, for example based on an epoxy resin.

As a further alternative, a connection layer can be provided which promotes adhesion via a diffusion process. By way of example, germanium-gold layers, metal-oxide layers, metal nitride layers and/or dielectric layers are suitable for this purpose. The latter may contain or consist of, for example, SiO, SiN and/or TiN.

In another different refinement, a connection without any joining layer is envisaged, that is to say a connection at a connection surface but without a connection layer between the carrier substrate wafer and the semiconductor layer sequence.

The adhesion between the carrier substrate wafer and the adjacent surface in the growth direction is then promoted for example by electrostatic forces and/or by diffusion which, for example, can lead to the formation of a eutectic mixture. By way of example, the connection can be produced by applying an electrical voltage between the semiconductor layer sequence and the carrier substrate wafer, and/or by supplying heat to the carrier substrate wafer and/or to the semiconductor layer sequence.

If a connection is produced only in places from the start between the semiconductor layer sequence and the carrier substrate wafer, the connection in places is preferably produced by means of a soldering process. For this purpose, in one expedient refinement of the method, the solder layer is applied already in a structured manner, corresponding to the desired pattern of the connection layer, to that main surface of the carrier substrate wafer which is to be connected to the semiconductor layer sequence, or to the rear side, facing the carrier substrate wafer, of the semiconductor layer sequence.

The structure is in this case preferably achieved by means of a mask through which the solder is applied, for example by vapour deposition or sputtering. In one alternative refinement, the solder is applied over the entire area and is structured in a subsequent method step which, for example, comprises a lithographic process.

In addition, it is also possible to produce a structured adhesive surface or to produce a structured connection without a joining layer, for example by anodic bonding, for example by anodic bonding of a structured layer, in particular a structured electrically conductive layer such as a metal layer.

The method according to the invention can result in subregions of the semiconductor layer sequence, such as edge regions of the semiconductor layer sequence and/or regions between the semiconductor layer stacks which are intended for the semiconductor bodies, the subregions not being a part of the desired semiconductor bodies and in the present context not being referred to as semiconductor layer stacks, either. These are preferably not connected to the carrier substrate wafer at all or are detached from the carrier substrate wafer again after connection, for example after connection over the entire area of the semiconductor layer sequence and carrier substrate wafer. These subregions are then preferably removed after the cuts have been formed through the semiconductor layer sequence and through the carrier substrate wafer in order to define the semiconductor layer stacks. Alternatively, regions of the semiconductor layer sequence such as these can be connected to parts of the carrier substrate wafer which do not represent carrier substrates—for example to edge regions of the carrier substrate wafer.

However, the method is preferably carried out, that is to say the semiconductor layer sequence is subdivided by means of cuts, in such a way that the subregions of the semiconductor layer sequence which are not used for semiconductor bodies make up as small a proportion as possible of the entire semiconductor layer sequence.

The method according to the invention can advantageously be used to produce semiconductor bodies in a wafer assembly, wherein in each case a part of that surface of the carrier substrate which faces the semiconductor layer stack is not covered by the semiconductor layer stack. The method at the same time advantageously allows very good utilization of the available semiconductor layer sequence thus making it possible to ensure that the semiconductor bodies are produced cost-effectively.

In a preferred embodiment of the method, a contact layer— which is preferably at least partially radiation-permeable—is applied to a semiconductor body and at least partially covers a surface, facing away from the carrier substrate, of its semiconductor layer stack and at least a part of the connecting region of its carrier substrate, that is to say the region which does not overlap the semiconductor layer stack. In any case, the contact layer preferably essentially covers the entire surface, facing away from the carrier substrate, of the semiconductor layer stack.

In one preferred embodiment, the contact layer is drawn from the front side of the semiconductor layer stack over at least one side surface onto the connecting region of the carrier substrate. The contact layer therefore preferably also at least partially covers at least one side surface of the semiconductor layer stack.

Particularly in this embodiment, it may be expedient to produce the contact layer from a plurality of parts. For example, subregions of the contact layer can be produced successively, for example when they are applied to surfaces which are not mutually parallel. Furthermore, it is possible for a subregion of the contact layer which in particular is also formed on the front side of the semiconductor layer stack to have a material which is at least partially permeable for electromagnetic radiation, while another subregion is essentially impermeable to radiation. Subregions of the contact layer are expediently adjacent to one another or overlap, such that they are electrically conductively connected.

The contact layer or a subregion of the contact layer preferably has a transparent conductive oxide (TCO), in particular indium tin oxide (ITO) and/or a conductive polymer, or consists thereof.

For example, the contact layer can be deposited directly on the semiconductor body. Alternatively it can, for example, be applied to a carrier film and can then be laminated onto the semiconductor body. If, for example, the contact layer is a conductive polymer, the contact layer itself may represent a film and in particular may be laminated onto the semiconductor body. These method steps are described, for example, in the document DE 103 39 985 A1, the disclosure content of which is hereby incorporated herein by reference.

In an expedient embodiment a first electrically insulating layer is applied at least to a part of the connecting region of the carrier substrate before forming the contact layer. This is particularly expedient in the case of an electrically conductive carrier substrate in order not to electrically short the semiconductor layer stack.

If the contact layer is drawn over a side surface of the semiconductor layer stack onto the connecting region of the carrier substrate then, preferably at least in the area of the contact layer, a second electrically insulating layer is applied to this side surface.

The first and/or the second electrically insulating layer may, for example, have a silicon oxide and/or a silicon nitride, such as $SiO_2$, SiN or $SiO_xN_y$. It may also be a plastic or polymer layer. It is then preferably laminated on or sprayed on. If the contact layer is applied to a carrier film or the contact layer represents a film, the first and/or the second electrically insulating layer can also be applied thereto. The first and/or the second electrically insulating layer is then preferably applied together with the contact layer to the semiconductor body, in particular by being laminated on. These method steps are described, for example, in the document DE 103 39 985 A1 the disclosure content of which is hereby incorporated herein by reference.

The first and/or the second electrically insulating layer may, for example, have a silicon oxide and/or a silicon nitride, such as $SiO_2$, SiN or $SiO_xN_y$. It may also be a plastic or polymer layer. It is then preferably laminated on or sprayed on. If the contact layer is applied to a carrier film or the contact layer represents a film, the first and/or the second electrically insulating layer can also be applied thereto. The first and/or the second electrically insulating layer is then preferably applied together with the contact layer to the semiconductor body, in particular by being laminated on. These method steps are described, for example, in the document DE 103 39 985 A1 the disclosure content of which is hereby incorporated herein by reference.

In a further embodiment, a first and/or a second electrical connecting layer, for example a bond pad, are/is formed on the connecting region of the carrier substrate. In particular, the first and/or second electrical connecting layer has a metal. For example, the first and/or second electrical connecting layer comprises or consists of at least one of the following materials: AuSn, PdIn, Sn, Au, Al, Bi.

In this case, the first electrical connecting layer is preferably arranged on the contact layer and is in this way electrically conductively connected to the front side of the semiconductor layer stack.

The second electrical connecting layer is preferably electrically conductively connected to the rear side, facing the carrier substrate, of the semiconductor layer stack.

If the carrier substrate wafer is sufficiently electrically conductive, it can be arranged for this purpose directly on the carrier substrate, and the carrier substrate can act as an electrical connection between the second connecting layer and the rear side of the semiconductor layer stack. In this case, the second connecting layer can be applied to the front side, facing the semiconductor layer stack, or to the rear side, facing away from the semiconductor layer stack, of the carrier substrate.

In the case of a carrier substrate wafer which is not sufficiently electrically conductive, a sufficiently electrically conductive layer, which at least partially covers the connecting region of the carrier substrate wafer, and on which the second connecting layer is then formed, is preferably arranged between the carrier substrate wafer and the semiconductor layer sequence.

In this case, the electrically conductive layer is preferably applied before the semiconductor layer sequence is connected to the carrier substrate wafer. By way of example, it can be applied in a structured form or can be structured after being applied.

If a connection which is structured from the start is produced in the method, the electrically conductive layer is expediently applied to the carrier substrate wafer.

If a connection over the entire area is produced initially, the electrically conductive layer can be applied both to the semiconductor layer sequence and the carrier substrate wafer. That part of the electrically conductive layer which is arranged on the connecting region of the carrier substrate is expediently exposed when the connection between the semiconductor layer sequence and the carrier substrate wafer is partially detached. If a sacrificial layer is provided, the electrically conductive layer is preferably adjacent to it.

If the semiconductor layer stack has a first subregion which projects at right angles to the growth direction over the edge of the carrier substrate, that is to say it does not overlap the carrier substrate, the second electrical connecting layer can alternatively be formed on the rear side of this first subregion of the semiconductor layer stack. In this situation—for example in the case of an electrically insulating carrier substrate or a carrier substrate which is not sufficiently conductive—the second electrical connecting layer can also extend onto the rear side of the carrier substrate and can partially or completely cover it. In the case of an electrically insulating carrier substrate, the semiconductor body can therefore also advantageously be fitted into conventional component housings, and made contact with, in a simple manner—for example by means of conventional die-bonding methods.

In one embodiment of the method, the semiconductor layer sequence comprises a growth substrate wafer. By way of example, this may be a bulk substrate wafer (=wafer consisting of a uniform material, preferably of a semiconductor material), or a quasi-substrate wafer which, for example, comprises a mount and a layer consisting of a semiconductor material applied to it. The other layers of the semiconductor layer sequence are preferably epitaxially grown on the growth substrate wafer. In one embodiment, the growth substrate wafer can be thinned or removed before or after the semiconductor layer sequence is connected to the carrier substrate wafer.

In one embodiment, the semiconductor layer sequence is based on an III-V compound semiconductor material, for example on a nitride compound semiconductor material or a phosphide compound semiconductor material. In another embodiment, the semiconductor layer sequence is based on an II-VI compound semiconductor material.

An III-V compound semiconductor material has at least one element from the third main group of the periodic table, for example Al, Ga, In, and an element from the fifth main group of the periodic table, such as B, N, P, As. In particular, the expression "III-V compound semiconductor material" covers the group of binary, ternary or quaternary compounds which contain at least one element from the third main group of the periodic table and at least one element from the fifth main group of the periodic table, in particular nitride and phosphide compound semiconductors. A binary, ternary or quaternary compound such as this may also, for example, have one or more dopants and additional constituents.

In a corresponding manner, an II-VI compound semiconductor material has at least one element from the second main group of the periodic table, such as Be, Mg, Ca, Sr and an element from the sixth main group of the periodic table, such as O, S, Se. In particular, an II-VI compound semiconductor material comprises a binary, ternary or quaternary compound which comprises at least one element from the second main group of the periodic table and at least one element from the sixth main group of the periodic table. A binary, ternary or quaternary compound such as this may furthermore, for example, have one or more dopants as well as additional constituents. By way of example, II-VI compound semiconductor materials include: ZnO, ZnMgO, CdS, ZnCdS, MgBeO.

In the present context, "based on nitride semiconductor material" means that the semiconductor layer sequence or at least a part of it, particularly preferably at least the active zone and/or the growth substrate wafer, comprises or consists of a nitride compound semiconductor material, preferably $Al_n Ga_m In_{1-n-m}N$, where $0 \leq n \leq 1$, $0 \leq m \leq 1$ and $n+m \leq 1$. In this case, this material need not necessarily have a mathematically exact composition corresponding to the above formula. In fact, for example, it may have one or more dopants as well as additional constituents. However, for the sake of simplicity, the above formula includes only the essential constituents of the crystal lattice (Al, Ga, In, N) even if, in some cases, these may be replaced and/or supplemented by small amounts of other substances.

In this context, "based on phosphide compound semiconductor material" means that the semiconductor layer sequence or at least a part of it, particularly preferably at least the active zone and/or the growth substrate wafer, preferably comprises $Al_n Ga_m In_{1-n-m}P$ or $As_n Ga_m In_{1-n-m}P$ where $0 \leq n \leq 1$, $0 \leq m \leq 1$ and $n+m \leq 1$. In this case, this material need not necessarily have a mathematically exact composition corresponding to the above formula. In fact, it may have one or more dopants as well as additional constituents. However, for the sake of simplicity, the above formula includes only the essential constituents of the crystal lattice (Al or As, Ga, In, P) even if in some cases, these may be replaced by small amounts of other substances.

The carrier substrate wafer preferably has sapphire or consists of sapphire. However, other materials, for example semiconductor wafers which preferably have or consist of GaN or SiC, can also be used as carrier substrate wafers. Metal plates, plastic panels or glass panes can also be used as carrier substrate wafers.

At least one cut through the semiconductor layer sequence and an adjacent cut through the carrier substrate wafer which bound the same semiconductor body or the same semiconductor bodies are preferably offset with respect to one another by 50 μm or more. Particularly preferably, they are offset by 100 μm or more with respect to one another. In other words, the projections of these cuts into the connection plane of the semiconductor layer sequence and the carrier substrate wafer have a separation of greater than or equal to 50 μm, preferably of greater than or equal to 100 μm.

The semiconductor body which is bounded by the cuts then has a connecting region of the carrier substrate and/or a first subregion of the semiconductor layer stack which has an extent of greater than or equal to 50 μm, preferably of greater than or equal to 100 μm, along the first and/or second offset direction.

In one advantageous embodiment, the carrier substrate is arranged on an expandable support and the expandable support expands thus increasing the distances between the semiconductor bodies. In other words, the semiconductor bodies are drawn apart from one another when the expandable support expands.

By way of example, the expandable support is for this purpose connected to the semiconductor layer sequence. The connection between a semiconductor body, in particular the semiconductor layer sequence, and the expandable support is expediently designed such that it is not completely detached during expansion of the expandable support. In other words, the semiconductor body still adheres to the expandable support during expansion. For example, the adhesion between the semiconductor layer sequence and the expandable support is promoted by means of adhesion, an adhesive layer and/or a lacquer layer. In another embodiment, the semiconductor layer sequence is clamped in between two expandable supports, for example with one expandable support being adjacent to the front side and the other adjacent to the rear side of the semiconductor layer sequence.

This advantageously simplifies the further processing of the semiconductor bodies. At the same time, on expansion of the expandable support, the second subregion of a semiconductor body which may still be covered by one or more semiconductor layer stacks of adjacent semiconductor bodies before the semiconductor bodies are drawn apart, is in each case at least partially exposed. The semiconductor bodies can then be taken individually from the expandable support in a simple manner.

In this case, the expandable support is expanded essentially parallel to the connection plane between the semiconductor layer sequence and the carrier substrate wafer.

Depending on the arrangement of the cuts through the semiconductor layer sequence and through the carrier substrate wafer, it may be sufficient for the expandable support to be expanded in only one direction. However, it may also be advantageous—particularly if the semiconductor layer stack of a semiconductor body projects in more than one offset direction over the respectively associated carrier substrate—for the expandable support to be expanded in a plurality of directions, for example in two mutually perpendicular directions. By way of example, the expansion may take place essentially isotropically on the main extent plane of the expandable support.

In one embodiment, the expandable support comprises a film, for example of polyethylene. In one variant, the film is coated with adhesive on its side facing the semiconductor layer sequence. In another embodiment, the expandable support has an expandable mesh or comprises such an expandable mesh.

An expandable mesh is generally a mesh-like material whose expansion capability is increased in particular by the formation of meshes. An expandable mesh may be a metal ("expandable metal"), however it may also be produced, for example, from a plastic. An expandable mesh may, for example, be formed by stamping or offset cuts in a material, preferably without any material loss occurring and with the material being deformed such that it can be expanded.

In addition to its expansion capability, an expandable mesh advantageously has high dimensional stability, particularly in the direction at right angles to the plane on which the expansion takes place. Furthermore, the expansion capability of an expandable mesh can be specifically adjusted along specific spatial directions by a suitable formation of the mesh structures, such that the magnitude and direction of the expansion can be appropriately matched to the cuts through the semiconductor layer sequence and through the carrier substrate wafer.

A radiation-emitting semiconductor body according to the invention comprises a carrier substrate and a semiconductor layer stack, which is suitable for producing electromagnetic radiation, wherein the semiconductor layer stack is arranged at least partially above a first region of the carrier substrate in such a way that a connecting region of the carrier substrate is free of the semiconductor layer stack; and in which a first subregion of the semiconductor layer stack projects beyond the edge of the carrier substrate.

In other words, only a second subregion of the semiconductor layer stack overlaps the carrier substrate. In a plan view of the semiconductor layer stack, that is to say of the surface of the semiconductor layer stack facing away from the carrier substrate, the first subregion of the semiconductor layer stack is arranged alongside the carrier substrate. The first subregion of the semiconductor layer stack therefore represents an overhang with respect to the carrier substrate.

In one particularly preferred embodiment, those surfaces of the semiconductor layer stack and of the carrier substrate which are essentially parallel to the connection plane have virtually the same extent.

The semiconductor layer stack and the carrier substrate therefore preferably have the same edge lengths on the main extent plane. Their respectively adjacent side surfaces are, however, not always flush with one another, but are offset with respect to one another. In other words, the semiconductor layer stack and the carrier substrate are not coincident in a plan view of that surface of the semiconductor layer stack which faces away from the carrier substrate. Instead of this, the semiconductor layer stack projects along at least one offset direction beyond at least one side surface of the carrier substrate such that the first subregion of the semiconductor layer stack represents an overhang with respect to the carrier substrate.

In one preferred embodiment, a contact layer—which is preferably at least partially radiation-permeable—is applied to the semiconductor body and at least partially covers a surface of the semiconductor layer stack facing away from the carrier substrate and at least a part of the connecting region of the carrier substrate. In any case, the contact layer preferably essentially covers the entire surface of the semiconductor layer stack facing away from the carrier substrate.

In one preferred embodiment, the contact layer is drawn from the front side of the semiconductor layer stack over at least one side surface onto the connecting region of the carrier substrate. The contact layer therefore preferably also at least partially covers at least one side surface of the semiconductor layer stack.

The contact layer may be formed from a plurality of parts. For example, it is possible for one subregion of the contact layer, which subregion is also arranged in particular on the front side of the semiconductor layer stack, to have a material which is at least partially permeable for electromagnetic radiation, while another subregion is essentially impermeable to radiation. Subregions of the contact layer are expediently adjacent to one another or overlap, as a result of which they are electrically conductively connected.

The contact layer or a subregion of the contact layer preferably contains a transparent conductive oxide (TCO), for example indium tin oxide (ITO) and/or a conductive polymer, or consists of one of these materials.

In a preferred embodiment, a first electrically insulating layer is applied to the connecting region of the carrier substrate between the carrier substrate and the contact layer and covers the connecting region of the carrier substrate at least in places. The first electrically insulating layer may, for example, prevent the semiconductor layer stack from being shorted via a conductive carrier substrate and the contact layer.

If the contact layer also extends over a side surface of the semiconductor layer stack, a second electrically insulating layer is preferably applied to the side surface of the semiconductor layer stack and partially or completely covers the side surface, in particular in the area of the contact layer. The first electrically insulating layer which is arranged on the carrier substrate wafer particularly preferably also extends as a second electrically insulating layer onto the side surface of the semiconductor layer stack.

A first electrical connecting layer or the first and a second electrical connecting layer can be arranged on the connecting region of the carrier substrate. The first electrical connecting layer is electrically conductively connected to the front side of the semiconductor layer stack, and for this purpose is preferably arranged on the contact layer. The second electrical connecting layer is electrically conductively connected to the rear side of the semiconductor layer stack. By way of example, a connecting wire can be attached to the first and/or the second electrical connecting layer, via which connecting wire the semiconductor body is supplied with the electric current required for its operation.

There is advantageously no need to arrange an electrical connecting layer, such as a bond pad, on the front side of the semiconductor layer stack facing away from the carrier substrate. There is also no need to route connecting wires over the front side of the semiconductor layer stack.

The surface area through which radiation is emitted from the semiconductor body is therefore advantageously not reduced by a radiation-absorbing connecting layer. Furthermore, in the case of a semiconductor body according to the invention, an optical element which is arranged downstream from the front side of the semiconductor layer stack can be arranged particularly close to the front side, provided that no connecting wire is routed over it.

The second electrical connecting layer is preferably arranged on the rear side, opposite the front side, of the first subregion of the semiconductor layer stack and particularly preferably also extends onto the rear side, facing away from the semiconductor layer stack, of the carrier substrate, particularly if, for example, the carrier substrate is not sufficiently electrically conductive.

Electrical contact can therefore be made with the semiconductor layer stack in a simple manner. For example, in this embodiment, there is no need for the connecting region of the carrier substrate to be structured on its main extent plane into a plurality of regions which are electrically isolated from one another, in order to apply the first and the second electrical contact surface.

In one expedient embodiment of the semiconductor body, the semiconductor layer stack comprises a growth substrate on which the other layers of the semiconductor layer stack are grown, preferably epitaxially.

The growth substrate may be a bulk substrate or a quasi-substrate. In this case, a bulk substrate generally consists of a uniform material—for example a semiconductor material—which is well suited for growing a semiconductor layer sequence from the materials of the semiconductor layer stack. By way of example, a quasi-substrate comprises a mount and a layer of a material such as this, which layer is applied to this mount and is generally thin.

The semiconductor layer stack is preferably based on an III-V compound semiconductor material, in particular a phosphide or nitride compound semiconductor material, or on an II-VI compound semiconductor material. The carrier substrate preferably has sapphire or consists of sapphire.

The contact layer is preferably at least partially permeable for the electromagnetic radiation produced by the semiconductor layer stack during operation. By way of example, it may consist of a transparent conductive oxide, in particular indium tin oxide (ITO), or may have a material such as this.

In one particularly preferred embodiment, one edge of the connecting region of the carrier substrate is offset with respect to an adjacent side surface of the semiconductor layer stack, in a plan view of the front side of the semiconductor layer stack, by 50 μm or more, particularly preferably by 100 μm or more.

In other words, the extension of the connecting region of the carrier substrate in at least one offset direction is greater than or equal to 50 μm, in particular greater than or equal to 100 μm.

In a further embodiment, one side surface of the first subregion of the semiconductor layer stack and an adjacent edge of the carrier substrate are offset by 50 μm or more with respect to one another.

Analogously to the connecting region of the carrier substrate, the first subregion of the semiconductor layer stack therefore has an extension which is greater than or equal to 50 μm in at least one offset direction.

A cavity which is bounded by the first subregion of the semiconductor layer stack, the carrier substrate and by a planar base is, according to a further embodiment, at least partially filled with a filling material.

In other words, the region which is arranged under the overhang formed by the first subregion of the semiconductor layer stack is at least partially filled with a filling material. This advantageously results in an enlarged essentially planar positioning surface being formed by the carrier substrate and the filling material on the side of the carrier substrate facing away from the semiconductor layer stack. The entire cavity is particularly preferably filled with filling material.

On the one hand, this advantageously increases the mechanical robustness and/or the stability of the semiconductor body. On the other hand, if appropriate, a filling material such as this can advantageously provide protection against mechanical damage for a second electrical connecting layer, which is applied to the rear side of the first subregion of the semiconductor layer stack, and/or for a connecting wire attached thereto.

By way of example, the filling material may be an epoxy resin, a polychlorinated biphenyl (PCB) or bis-benzocyclobutene (BCB). The filling material is particularly preferably thermally matched to the coefficient of expansion of the carrier substrate and/or of the semiconductor layer stack.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further advantages and advantageous embodiments and developments of the invention will become evident from the exemplary embodiments which are described in the following text in conjunction with FIGS. 1A to 6E, in which:

FIGS. 1A to 1G show schematic section illustrations of an optoelectronic semiconductor body in various stages of the first exemplary embodiment of a method according to the invention, FIGS. 2A and 2B show schematic plan views of a plurality of optoelectronic semiconductor bodies in the stages of the method illustrated in FIGS. 1D and 1E, FIGS. 3A and 3B show schematic section illustrations of an optoelectronic semiconductor body in various stages of the second exemplary embodiment of a method according to the invention.

DETAILED DESCRIPTION OF THE PRESENTLY PREFERRED EMBODIMENTS

In the exemplary embodiments and figures, identical components and components having the same effect are each provided with the same reference symbols. The illustrated elements and their size ratios with respect to one another should in principle not be regarded as being true to scale and in fact individual elements, such as layers, may be illustrated with their size exaggerated in order to illustrate them better and/or to assist understanding.

Figure 1A:
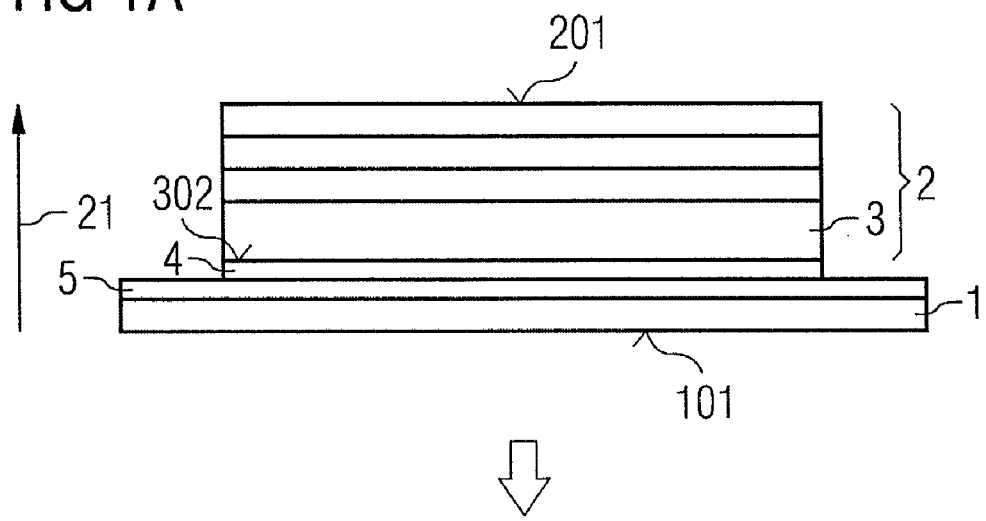

In the exemplary embodiment of the method according to the invention of producing a plurality of radiation-emitting semiconductor bodies, as illustrated in FIGS. 1A to 1G, a semiconductor layer sequence 2 is provided which produces electromagnetic radiation during operation (cf. FIG. 1A).

By way of example, the semiconductor layer sequence 2 is based on GaN or some other nitride compound semiconductor material, and comprises a growth substrate wafer 3 on which the other layers of the semiconductor layer sequence 2 are epitaxially deposited. The epitaxial deposition is carried out, for example, by means of chemical vapour deposition (CVD) or physical vapour deposition (PVD), or some other suitable epitaxial deposition method.

The semiconductor layer sequence 2 in the present case is suitable for light emission and preferably comprises a pn-junction, a double-heterostructure, a single quantum well or, particularly preferably, a multiple quantum well structure (MQW) for radiation generation. The expression quantum well structure in this case does not include any indication of the dimensionality of the quantization. It therefore covers, inter alia, quantum troughs, quantum wires and quantum dots, and any combination of these structures. Examples of MQW structures are described in the documents U.S. Pat. No. 6,849,881, U.S. Pat. No. 5,831,277, U.S. Pat. No. 6,172,382 B1 and U.S. Pat. No. 5,684,309, the disclosure content of all of which is hereby incorporated herein by reference.

In the present case, the radiation which is generated during operation of the semiconductor body is emitted essentially through the front side 201, facing away from the carrier substrate wafer 1, of the semiconductor layer sequence 2 into the hemisphere located above it, thus resulting in the main emission direction 21 indicated by an arrow in FIG. 1A.

A sacrificial layer 4, for example consisting of InGaN, is applied to that surface 302 of the growth substrate wafer 3 which faces away from the other layers of the semiconductor layer sequence 2 and is partially destroyed during a subsequent process step.

Furthermore, a carrier substrate wafer 1 is provided and in the present case consists of sapphire. A carrier substrate wafer 1 consisting of sapphire has the advantage for the present exemplary embodiment that it is at least partially permeable for electromagnetic radiation and has a similar thermal coefficient of expansion to that of the semiconductor layer sequence 2.

A connection is produced between the semiconductor layer sequence 2 and the carrier substrate wafer 1 by means of a connection layer 5. In the present case, the connection layer 5 is formed on the carrier substrate wafer 1. The growth substrate wafer 3 is subsequently connected on the side 302, which faces away from the semiconductor layer sequence 2 and is covered by the sacrificial layer 4, to the connection layer 5 which is formed on the carrier substrate wafer 1.

Where appropriate, the growth substrate wafer 3 can be thinned or removed completely before or after the semiconductor layer sequence 2 is connected to the carrier substrate wafer 1, in order to counteract absorption in the growth substrate wafer 3 or other disadvantages of the material of the growth substrate wafer.

Particularly if the growth substrate wafer 3 is thinned or removed completely after the semiconductor layer sequence 2 has been connected to the carrier substrate wafer 1, the connection is preferably made in such a way that that side of the semiconductor layer sequence 2 which faces away from the growth substrate wafer 3 is connected to the carrier substrate wafer 1. In this case in particular, radiation which is produced by the semiconductor bodies during operation can be emitted through the carrier substrate wafer.

In the present case, the connection layer 5 consists of silicon oxide and/or silicon nitride, and the connection can be made using conventional methods for connecting two wafers. However, it is also possible to use an adhesive, for example an epoxy resin, or a solder, for example a solder metal such as Au, AuSn, Pd, In, PdIn or Pt.

Figure 1B:
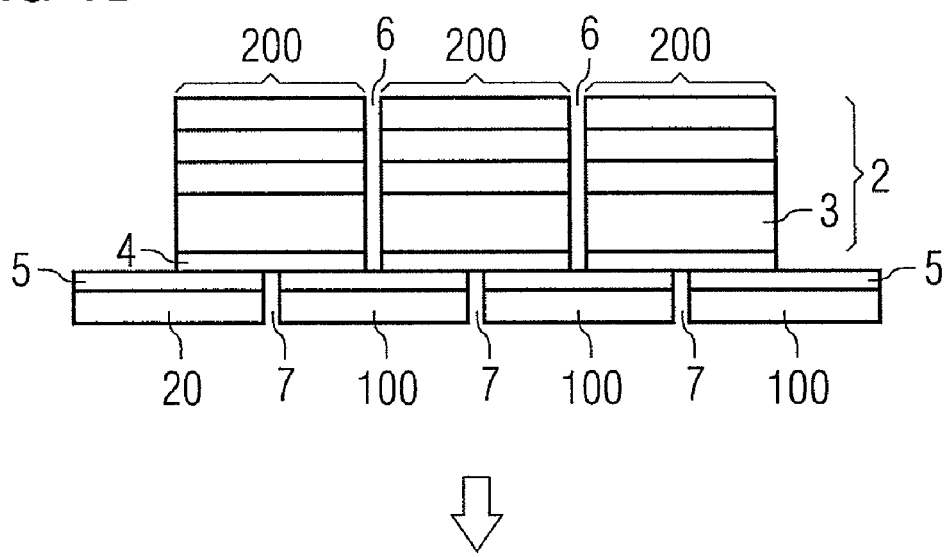

The semiconductor layer sequence 2 is then subdivided into individual semiconductor layer stacks 200 by means of cuts 6 from its front side 201, which faces away from the carrier substrate wafer 1 (cf. FIG. 1B). The cuts 6 in the present case also cut through the growth substrate wafer 3 and the sacrificial layer 4.

In the present case, the cuts 6 through the semiconductor layer sequence do not cut through the connection layer 5. In one expedient refinement of the exemplary embodiment, the cuts 6 through the semiconductor layer sequence 2 likewise cut through the connection layer 5. This may result in advantages, for example when the connection between the growth substrate wafer 3 and the carrier substrate wafer 1 is subsequently detached in places.

Depending on the depth of the cuts 6 through the semiconductor layer sequence 2, these can in alternative refinements of the method produce trenches in the connection layer 5 or in the carrier substrate wafer 1, but without completely cutting through the carrier substrate wafer 1.

The carrier substrate wafer 1 is subdivided into individual carrier substrates 100 from its rear side 101, which faces away from the semiconductor layer sequence 2, by means of cuts 7 which are offset with respect to the cuts 6 through the semiconductor layer sequence 2.

A plurality of cuts 6, 7 through the semiconductor layer sequence and, respectively, through the carrier substrate wafer run outside the section plane shown in FIG. 1B and at right angles to the cuts 6, 7 shown in FIG. 1B (cf. FIG. 2A), such that, in the present case, carrier substrates and semiconductor layer stacks are created with a rectangular, preferably square, base area. However, the cuts need not be at right angles to one another but can also run obliquely with respect to one another at a different angle, for example such that semiconductor layer stacks and/or carrier substrates can be produced which have a triangular or parallelogram-like base area.

Adjacent cuts 6 through the semiconductor layer sequence and adjacent cuts 7 through the carrier substrate wafer have the same distance according to this exemplary embodiment, such that the edge lengths of the carrier substrates 100 and of the semiconductor layer stacks 200 are identical on the main extent plane.

If the intention is to manufacture semiconductor bodies with different dimensions, then the cut separations can also be varied over the wafer.

The cuts 7 through the carrier substrate wafer 1 in the present case also cut through the connection layer 5, but not the sacrificial layer 4. In an expedient refinement of the exemplary embodiment, the cuts 7 through the carrier substrate wafer 1 likewise cut through the sacrificial layer 4. This may result in advantages, for example when the sacrificial layer 4 is subsequently broken down in places.

Depending on the depth of the cuts 7 through the carrier substrate wafer 1, in alternative refinements of the method, these cuts 7 can produce trenches in the sacrificial layer 4 or, cutting through the sacrificial layer 4, in the growth substrate wafer 3, or, cutting through the sacrificial layer 4 and the growth substrate wafer 3, in one of the other layers of the semiconductor layer sequence 2, but without completely cutting through the semiconductor layer sequence 2 during this process.

In the present case, the cuts 6 through the semiconductor layer sequence and the cuts 7 through the carrier substrate wafer 1 are arranged such that none of the regions which would be included by an imaginary continuation of a cut 7 through the carrier substrate wafer 1 to the front side 201 of the semiconductor layer sequence 2 completely contains the cuts 6 through the semiconductor layer sequence 2.

In other words, none of the cuts 6 through the semiconductor layer sequence 2 represents the extension of a cut 7 through the carrier substrate wafer 1. A quasi-one-dimensional region 24 (cf. FIG. 2A) where both the semiconductor layer sequence 2 and the carrier substrate wafer 1 are cut through is created only at those places at which a cut 7 through the carrier substrate wafer 1 and a cut 6 through the semiconductor layer sequence 2, which are not arranged parallel to one another, intersect.

As is illustrated in FIG. 1C, the sacrificial layer 4 is subsequently irradiated with laser radiation (indicated by the arrows 9) through a mask 8, the carrier substrate wafer 1 and the connection layer 5. Alternatively, the irradiation can be carried out before the semiconductor layer sequence 2 and/or the carrier substrate wafer 1 are/is subdivided.

The mask 8 is chosen such that a first subregion 210 (c.f., FIG. 1E), which is intended to be detached from the carrier substrate wafer 1, is irradiated in each semiconductor layer stack 200, while a second subregion 220 is shadowed. The second subregions 220, which are not intended to be irradiated, are in this case chosen such that, after the connection between the semiconductor layer stack 200 and the carrier substrates 100 has been detached in places, each of the carrier substrates 100 is still connected to one and only one semiconductor layer stack 200.

The sacrificial layer 4 absorbs a portion of the laser radiation 9, and is disintegrated at the irradiated points. A laser cutting method such as this is described, for example, in the document U.S. Pat. No. 6,559,075, the disclosure content of which has been incorporated herein by reference.

After irradiation with the laser radiation 9, in each case one semiconductor layer stack 200 is connected to one and only one carrier substrate 100. The connection of a semiconductor layer stack 200 to one or more further carrier substrates 100 which are arranged at least partially under the semiconductor layer stack 200 is detached by the destruction of the sacrificial layer 4. A semiconductor layer stack 200 and the associated carrier substrate 100 which is connected to it together form a semiconductor body 10.

Regions 20 of the carrier substrate wafer 1 and regions of the semiconductor layer sequence 2 including the growth substrate wafer 3 etc. which are not a component of semiconductor bodies 10 after the cuts 6 and 7 have been produced can be removed in a simple manner in a further method step.

Before the assembly formed by the semiconductor layer sequence 2, the growth substrate wafer 3 and the carrier substrate wafer 1 is finally separated, the carrier substrate wafer 1 which has been subdivided into individual carrier substrates 100 is connected to an expandable support 11 (cf. FIG. 1D). For example, the expandable support 11 is a film which comprises or consists of polyethylene, or consists of some other suitable material. Alternatively, an expandable mesh is used as the expandable support 11.

The connection between the expandable support 11 and the carrier substrate wafer 1 is designed to be sufficiently mechanically robust that it remains in existence during the subsequent expansion of the base, at least to such an extent that the semiconductor bodies 10 are still connected to the expandable support 11. The connection of the carrier substrates 100 to the expandable support 11 is thus at least not detached completely when the latter is expanded. By way of example, an adhesive or lacquer layer is arranged between the semiconductor bodies 10 and the expandable support 11, and promotes adhesion between them.

In the method according to this exemplary embodiment, the carrier substrate wafer 1 is preferably applied to the expandable support 11 already after the subdivision into carrier substrates 100 and before the cuts 6 are made through the semiconductor layer sequence 2. It is also feasible for this to be done only after the cuts 6 have been made through the semiconductor layer sequence 2.

Figure 1E:
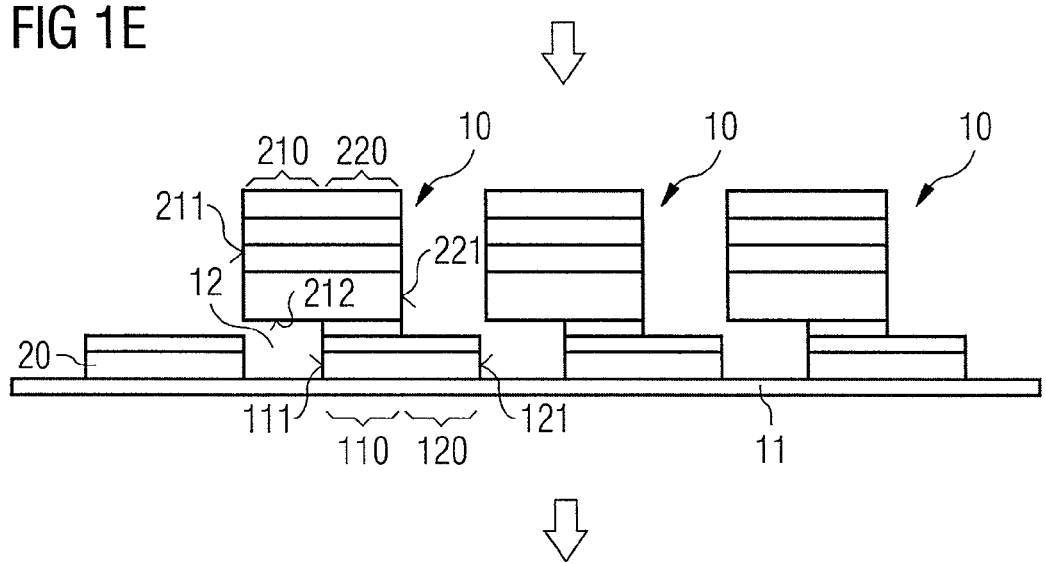

The expansion of the expandable support 11 on its main extent plane results in the semiconductor bodies 10 being drawn sufficiently far apart from one another (cf. FIG. 1E)

that adjacent semiconductor bodies 10 no longer overlap and they can thus be taken individually from the expandable support 11.

In an alternative embodiment of this exemplary embodiment, the expandable support 11 is connected to the front side 201 of the semiconductor layer sequence 2, and the cuts 7 are subsequently made through the carrier substrate wafer 11 before the expandable support 11 is then stretched out.

By drawing the semiconductor bodies 10 apart, the connecting regions 120 of the carrier substrates 100, which are no longer connected to the semiconductor layer stack 200 of the semiconductor body 10, are exposed. Before the semiconductor bodies 10 are drawn apart from one another, these connecting regions 120 overlap with semiconductor layer stacks 200 which belong to adjacent semiconductor bodies 10.

At the same time, rear sides 212 of the first subregions 212 of the semiconductor layer stacks 200 are exposed. The rear side 212 of the first subregion 210 of a semiconductor layer stack 200 forms an overhang over the associated carrier substrate 100 and, together therewith and with the expandable support 11, bounds a cavity 12.

After the expandable support 11 has been stretched out, the semiconductor bodies 10 are removed in a simple manner and in any desired sequence from the expandable support 11, for further method steps to be performed. However, they can also remain on the expandable support for further method steps, for example coating with a material which contains a luminescent material and/or diffuse or particles.

Figure 2B:
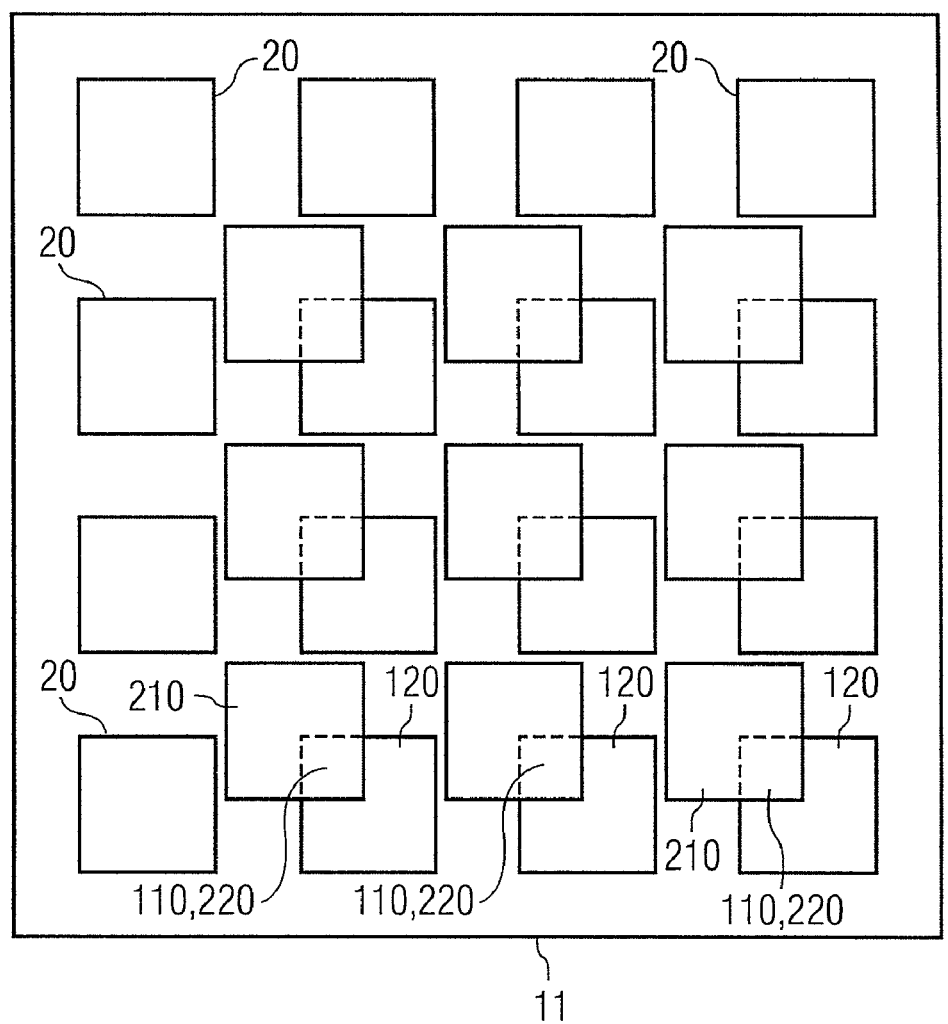

FIGS. 2A and 2B respectively show, in the form of a plan view, the semiconductor bodies 10, arranged on the expandable support 11, before and after separation and the expandable support 11 is stretched out.

FIG. 2B clearly shows how a first region 110 of each carrier substrate 100 which is associated with a semiconductor body 10 overlaps the associated semiconductor layer stack 200, while a connecting region 120 of the carrier substrate 100 comes to rest alongside the associated semiconductor layer stack 200.

A first subregion 210 of each semiconductor layer stack 200 projects in a first offset direction 22 and in a second offset direction 23 beyond the associated carrier substrate 100. A second subregion 220 of the semiconductor layer stack 200 overlaps the first region 110 of the carrier substrate 100.

After the expandable support 11 has been stretched out, a first electrically insulating layer 13a is applied to at least a part of the connecting region 120 of the carrier substrate 100 of the semiconductor body 10 and also extends as a second electrically insulating layer 13b over a side surface 221 of the semiconductor layer stack 200 (cf. FIG. 1F). In the present case, the first and the second electrically insulating layers 13a, 13b consist of silicon dioxide.

A contact layer 14, which for example consists of indium tin oxide (ITO), is subsequently applied to the front side 201 of the semiconductor layer stack 200 and extends on the electrically insulating layer 13b and 13a at least as far as a part of the connecting region 120 of the carrier substrate 100 (cf. FIG. 1F). The first and the second passivation layer 13a, 13b prevent the semiconductor layer stack 200 from being shorted through the contact layer 14.

A first electrical connecting layer 15, for example a metal layer which in particular has AuSn, is then applied to the part of the contact layer 14 which is formed on the connecting region 120 of the carrier substrate 100. A second electrical connecting layer 16, for example likewise a metal layer which in particular has AuSn, is applied to the rear side 212 of the first subregion 210 of the semiconductor layer stack 200 and to the rear side 101 of the carrier substrate 100, after the semiconductor body has been removed from the expandable support. The semiconductor body can therefore advantageously be fitted in conventional component housings using conventional die-bonding methods.

An electric current can be fed into the semiconductor body 10 via the first electrical connecting layer 15 and the second electrical connecting layer 16. By way of example, a connecting wire 17 can for this purpose be attached to the first electrical connecting layer 15, via which connecting wire 17 operating current can be supplied to the semiconductor body 10 (see FIG. 1G).

The cavity 12 under the overhang 210 may be at least partially filled, for example, with a filling compound 18 such as an epoxy resin or BCB. In the present case, this region 12 is virtually completely filled with filling compound 18 such that its lower face, facing away from the semiconductor layer stack 200, together with the rear side 101 of the carrier substrate 100 and/or together with the second electrical connecting layer 16 arranged thereon, forms a positioning surface for the semiconductor body 10. The stability of the semiconductor body 10 can thus be increased.

Figure 3A:
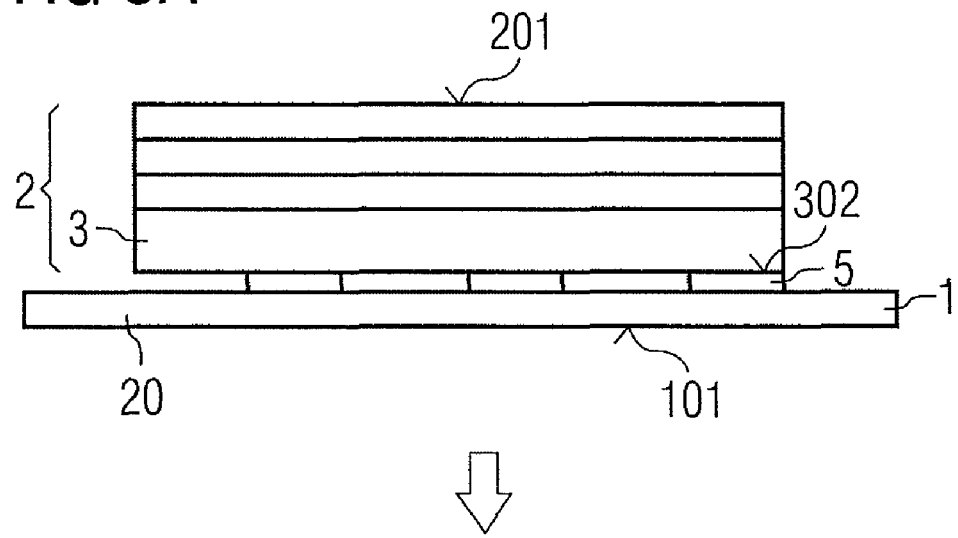
Figure 3B:
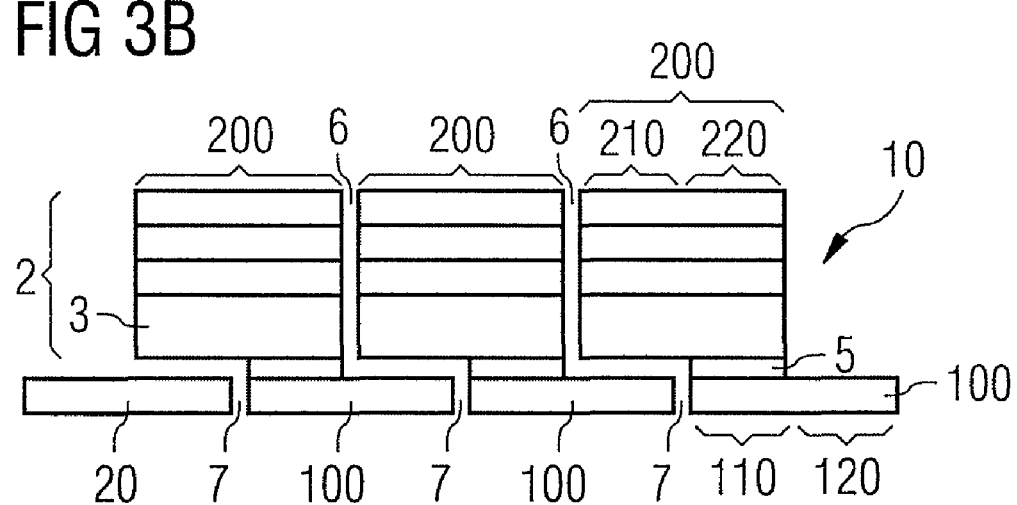

According to the exemplary embodiment illustrated in FIGS. 3A and 3B a carrier substrate wafer 1 and a semiconductor layer sequence 2, which semiconductor layer sequence 2 produces electromagnetic radiation during operation and comprises a growth substrate wafer 3 on which the other layers of the semiconductor layer sequence 2 are epitaxially grown, are provided in an analogous manner to the exemplary embodiment shown in FIGS. 1A to 1G.

A structured connection layer 5 is subsequently applied to the carrier substrate wafer 1. A solder metal such as Au, AuSn, Pd, In, PdIn or Pt, is applied through a mask as structured connection layer 5.

Alternatively, the connection layer 5 can be applied to the rear side 302, opposite the front side 201, of the assembly comprising the growth substrate 3, the other layers of the semiconductor layer sequence 2, and possibly further layers.

An unstructured connection layer 5, which is structured subsequently, for example by means of an etching process, can also be applied.

The rear side 302 and the carrier substrate wafer 1 are then joined together and heated, such that the solder metal melts and the solder layer produces a structured, mechanically robust connection between the carrier substrate wafer 1 and the semiconductor layer sequence 2.

Instead of a solder metal, an adhesive, for example an epoxy resin, can also be used to produce the structured connection layer 5. Depending on its characteristics, there may be no need to heat the connection layer 5, or this can be replaced or supplemented by another method step, for example for curing.

Analogously to the exemplary embodiment described first above, cuts 6 are then made through the semiconductor layer sequence 2, and cuts 7 are made through the carrier substrate wafer 1. These cuts 6, 7 subdivide the semiconductor layer sequence 2 into individual semiconductor layer stacks 200, and subdivide the carrier substrate wafer 1 into individual carrier substrates 100 (cf. FIG. 3B).

The structured connection layer 5 is designed such that each semiconductor layer stack 200 is connected to one and only one carrier substrate 100, thus resulting in individual semiconductor bodies 10. After subdivision into individual carrier substrates 100, the carrier substrate wafer 1 is arranged on an expandable support 11, preferably before the semiconductor layer sequence is subdivided by the cuts 6. This and the further method steps are carried out analogously to the exemplary embodiment shown in FIGS. 1D to 1G.

In the case of an optoelectronic semiconductor body (cf. FIG. 4A) produced according to the third exemplary embodiment of the method, the second electrical contact surface 16 is not arranged (as in the case of the exemplary embodiment shown in FIGS. 1F and 1G) on the rear side 212 of a first region 210 of the semiconductor layer stack 200. Instead of this, an electrically conductive layer 19 is arranged between the growth substrate 3 and the carrier substrate 100 and covers a part of the connecting region 120 of the carrier substrate 100 which is free of the semiconductor layer stack 200. A second electrical connecting layer 16 is then applied to this conductive layer 19.

The contact layer 14, however, is formed in a corresponding manner to the exemplary embodiment described first of all, as shown in FIGS. 1F and 1G.

In the present case, the carrier substrate 100 is electrically non-conductive, for example it consists of sapphire.

The contact layer 14 is therefore applied directly to the connecting region 120 of the carrier substrate 100 without a first passivation layer 13a being located between the two. A second passivation layer 13b is arranged on a side surface 221 of the semiconductor layer stack 200 in order to prevent the semiconductor layer stack from being shorted through the contact layer 14.

Figure 4A:
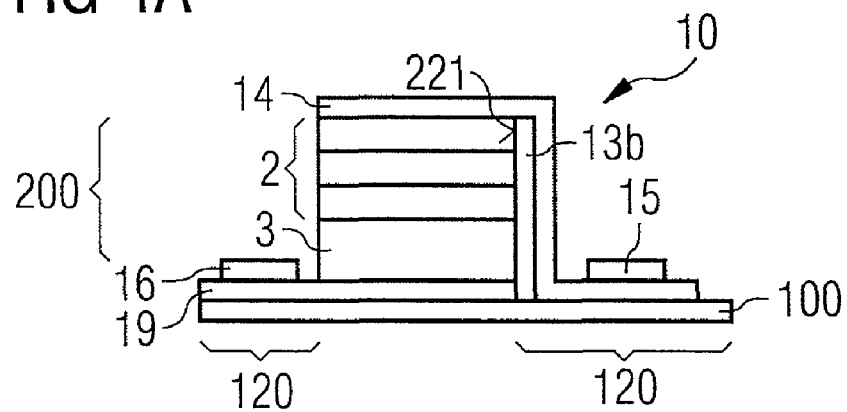
FIGS. 4A and 4B show a schematic section illustration and, respectively, a schematic plan view of an optoelectronic semiconductor body according to the invention, produced according to a third exemplary embodiment of a method according to the invention.
Figure 4B:
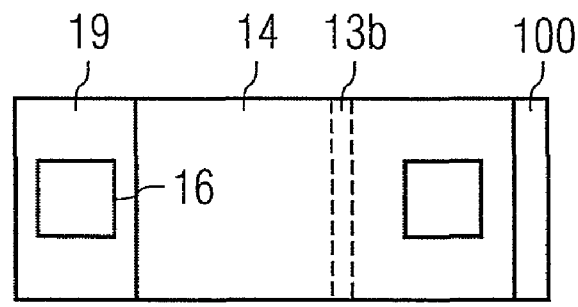
Figure 5:
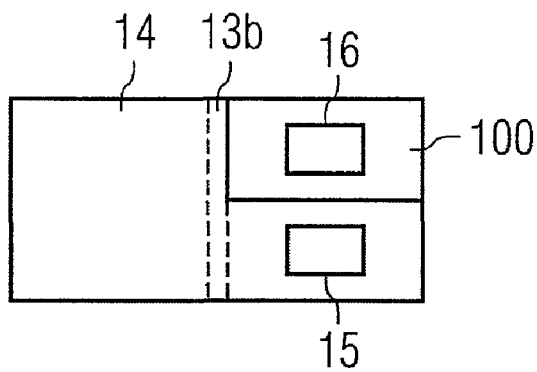
FIG. 5 shows a schematic plan view of an optoelectronic semiconductor body according to the invention, produced according to a fourth exemplary embodiment of a method according to the invention.

The first and the second electrical connecting layer 15, 16 do not, as illustrated in FIGS. 4A and 4B, need to be arranged on different sides of the semiconductor layer stack 200. An arrangement according to the semiconductor body shown in FIG. 5, in which both electrical connecting layers 15, 16 are adjacent alongside one another, adjacent to the same side surface 221 of the semiconductor layer stack 200, is particularly expedient and advantageous when the semiconductor layer stack 200 projects beyond the edge of the carrier substrate 100 on the side opposite the side surface 221, and has an overhang 210 over the adjacent end surface of the carrier substrate.

If the carrier substrate 100 and the growth substrate 3 are electrically conductive, the second electrical connecting layer 16 can be applied directly to the carrier substrate 100; otherwise a conductive layer 19 can be provided, analogously to the exemplary embodiment shown in FIG. 4A, which conductive layer 19 is arranged between the semiconductor layer stack 200 and the carrier substrate 100 and is drawn onto the connecting region 120 of the carrier substrate 100, in such a way that the second electrical connecting layer 16 can be placed on it.

If the carrier substrate 100 is electrically conductive and/or if the contact layer 14 is also intended to be applied to the conductive layer 19, a first electrically insulating layer 13a must be arranged, analogously to the exemplary embodiment shown in FIG. 1F, between the contact layer 14 and the conductive layer 19 or the conductive carrier substrate 100, respectively.

FIGS. 6A to 6E show various examples of the arrangement of the semiconductor layer stack 200 on the carrier substrate 100.

Figure 6A:
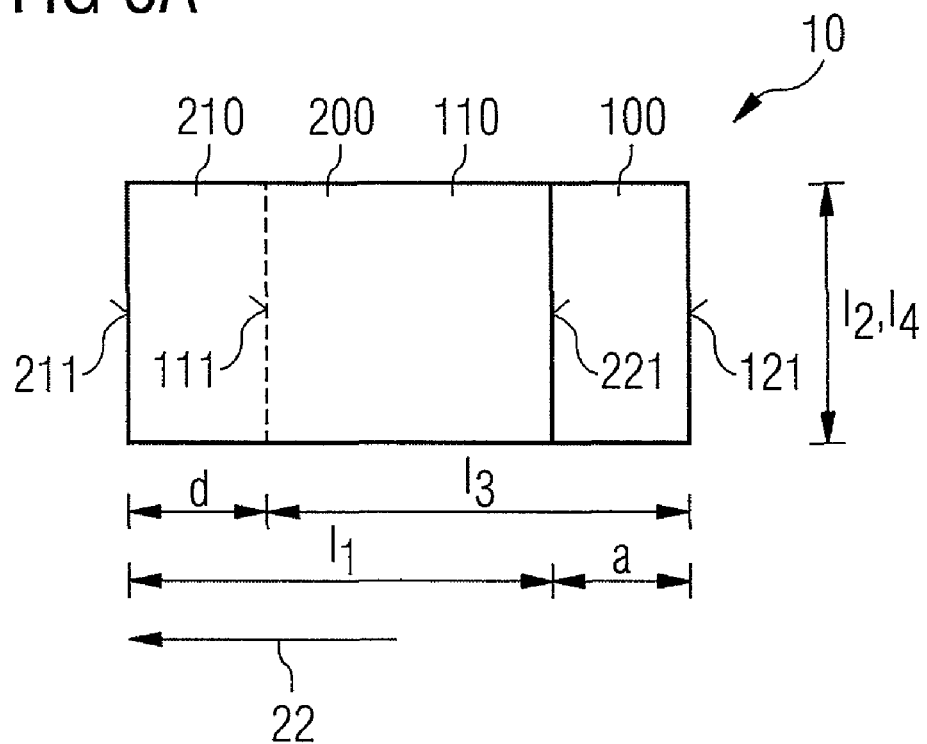
FIGS. 6A to 6E show schematic plan views of differently designed exemplary embodiments of optoelectronic semiconductor bodies according to the invention.

According to the exemplary embodiment shown in FIG. 6A, the semiconductor layer stack 200 and the carrier substrate 100 have a rectangular shape, in a plan view of the front side 201 of the semiconductor layer stack 200, with the side lengths $l_1$ and $l_2$, as well as $l_3$ and $l_4$, respectively. The side lengths of the semiconductor layer stack 200 and of the carrier substrate 100 are virtually the same in the present case, that is to say $l_1 = l_3$ and $l_2 = l_4$.

The short sides 211 and 221 of the semiconductor layer stack 200 are shifted parallel, that is to say they are arranged offset, with respect to the short sides 111, 121 of the carrier substrate 100. The two adjacent long sides of the semiconductor layer stack 200 and carrier substrate 100 in contrast each lie on a common plane. The semiconductor layer stack 200 in consequence projects on a short side of the semiconductor body 10 (in the offset direction 22) beyond a side 111 of the carrier substrate 100.

The side surface 211 of the first subregion 210 of the semiconductor layer stack 200 which projects beyond the carrier substrate 100 is in this case at a distance d from the adjacent side surface 111 of the first region 110 of the carrier substrate 100, which is covered by the semiconductor layer stack 200, with this distance d in the present case being greater than 50 μm.

In a corresponding manner, the side surface 121 of the connecting region 120 of the carrier substrate 100 is at a distance a from the adjacent side surface 221 of the semiconductor layer stack 200, which distance a in the present case assumes the same value as the distance d, as mentioned above.

The side surfaces of the semiconductor layer stack 200 and of the carrier substrate 100 which lie parallel to the plane which is covered by the offset direction 22 and the growth direction 21, that is to say the sides with the lengths $l_1$ and $l_3$, are not offset with respect to one another.

In the case of the method according to an embodiment of the invention for producing a plurality of radiation-emitting semiconductor bodies, a cut 6 is thus in each case made through the semiconductor layer sequence 2, and a cut 7 is made through the carrier substrate wafer 7, which cuts 6 and 7 run parallel to this plane, are not offset with respect to one another and form a common cut through the semiconductor body 10. This completely cuts through the semiconductor body 10 along the growth direction 21.

Figure 6B:
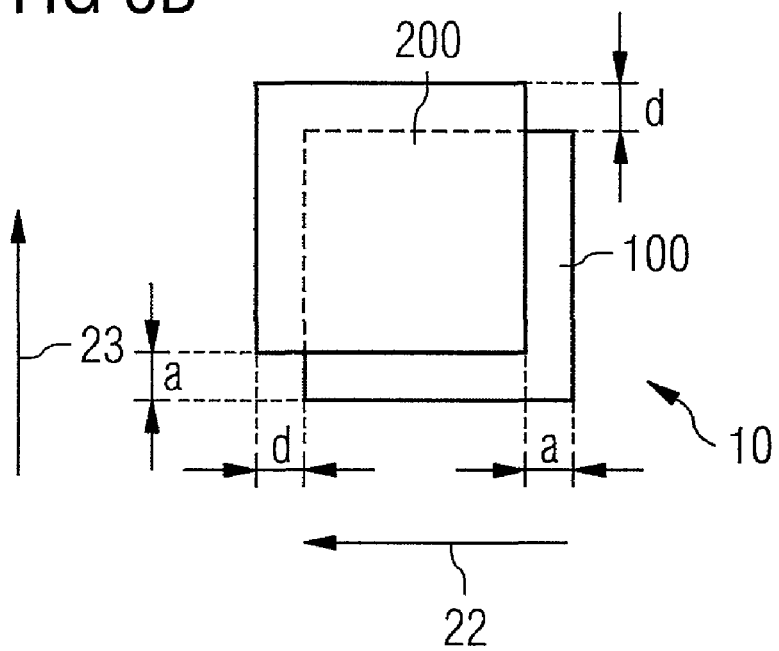

According to the exemplary embodiment in FIG. 6B, the semiconductor layer stack 200 does not just project beyond the carrier substrate 100 along one side surface in a first offset direction 22. Rather, the semiconductor layer stack is shifted diagonally with respect to the carrier substrate 100. In the present case, the distance d between each side surface 211 of the first subregion 210 of the semiconductor layer stack 200 and the respectively adjacent side surface 111 of the first region 110 of the carrier substrate 100 is in each case the same. Alternatively, the distance d along the first offset direction 22 may be greater or less than the distance along the second offset direction 23. In this case, the offset is not exactly diagonal.

As in the exemplary embodiment shown in FIG. 6A, the distance a between a side surface 121 of the connecting region 120 of the carrier substrate 100 and the respectively adjacent side surface 221 of the second subregion 220 of the semiconductor layer stack 200 corresponds to the distance d mentioned above.

Figure 6C:
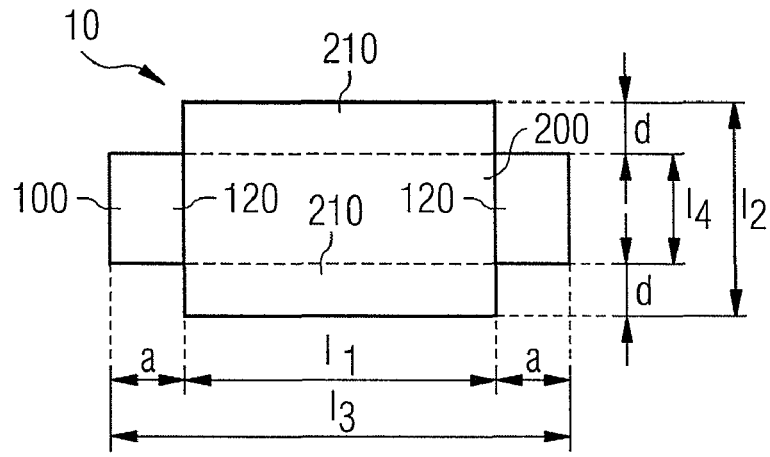

The semiconductor layer stack 200 and the carrier substrate 100 do not need to have the same dimensions along the main extent directions of the carrier substrate. The exemplary embodiment in FIG. 6C shows an example of a semiconductor layer stack 200 which has a shorter length $l_1$ than the associated carrier substrate 100, which has a length $l_3 > l_1$. In the present exemplary embodiment, the semiconductor layer stack 200 has a width $l_2$ which is greater than the width $l_4$ of the associated carrier substrate 100.

The semiconductor layer stack 200 is in this case arranged such that the center points of the semiconductor layer stack 200 and of the carrier substrate 100 are arranged one above the other, seen in a plan view of the semiconductor layer stack 200 in a longitudinal direction. The connecting region 120 of the carrier substrate 100 in this case projects beyond the semiconductor layer stack 200. The electrical connecting layers 15 and 16 can then be arranged as shown in FIGS. 4A and 4B, respectively. Along the width, the first subregion 210 of the semiconductor layer stack 200 in a longitudinal direction projects over the carrier substrate and represents an overhang 210. Alternatively, one or two side surfaces of the semiconductor layer stack 200 and of the carrier substrate 100 can also be arranged flush with one another.

Figure 6D:
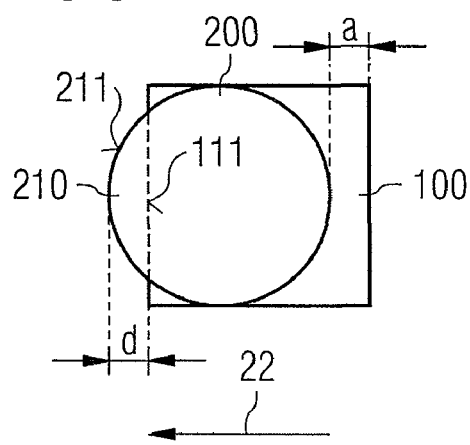

According to the exemplary embodiment illustrated in FIG. 6D, the semiconductor layer sequence 200, seen in a plan view of the semiconductor layer stack 200, has a circular cross section. It has a square carrier substrate 100 and is offset along an edge of this carrier substrate 100 such that it has a first subregion 210 the side surface 211 of which has a maximum distance d from the adjacent side surface 111 of the carrier substrate 100. A better light output can be achieved with a semi-conductor body such as this.

While such semiconductor bodies are being produced, parts of the semiconductor layer sequence 2 remain as waste between the semiconductor layer stacks 200, and are expediently removed.

Figure 6E:
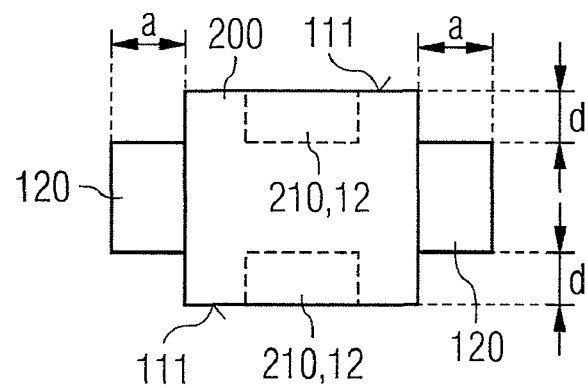

The side surfaces of the carrier substrate 100 in the case of the semiconductor body according to the exemplary embodiment shown in FIG. 6E have, for example, recesses 12 on two opposite sides 111. These recesses 12 extend over the entire thickness of the carrier substrate 100 and, for example, have a width which corresponds approximately to half the side length. In the area of these recesses 12, a first subregion 210 of the semiconductor layer stack projects beyond the adjacent edge of the carrier substrate and in each case represents an overhang 210, which is predetermined by the shape of the recesses 12 and has a depth d. In the present case, the recesses 12 have a rectangular cross section. However, they may also be formed with a semicircular, triangular or trapezoidal cross section.

The remaining side surfaces of the carrier substrate have projections 120 with respect to the semiconductor layer stack 200, which projections 120 preferably have the same dimensions as the recesses 12. If the projections 120 and the recesses 12 have the same dimensions, the cuts 6, 7 made while producing a plurality of such semiconductor bodies 10 can be made such that the projections 120 on one semiconductor body 10 are located in the recesses 12 in adjacent semiconductor bodies 10. Adjacent carrier substrates 100 then engage in one another in a similar manner to puzzle parts, as a result of which there is advantageously no waste of the semiconductor layer sequence between adjacent semiconductor layer stacks 200.

The projections 120 each have a depth a and represent the connecting region 120 of the carrier substrate 100, which is free from the semiconductor layer stack 200 and on which electrical contact surfaces 15, 16 can be arranged. In this case, by way of example, the arrangement may be configured as shown in FIGS. 4A and 4B. Alternatively, it is likewise possible for the second electrical contact surface 16 to be arranged on the rear side 212 of the semiconductor layer stack 200, in the region of one of the overhangs 210, as is shown in FIGS. 1F and 1G.

In the case of the semiconductor body 10 as shown in the exemplary embodiment in FIG. 6E, the carrier substrate 100 has no edge beyond which the semiconductor layer stack 200 projects at all points. The semiconductor body 10 therefore advantageously has a high stability.

Nevertheless, a plurality of such semiconductor bodies 10 can be produced using one of the exemplary methods according to the invention without parts of the semiconductor layer sequence 2 or of the carrier substrate wafer 1 between the semiconductor bodies 10 having to remain unused or to be removed.

The description based on the exemplary embodiments does not restrict the invention thereto. Rather, the invention covers every novel feature and every combination of features, in particular including every combination of features in the patent claims, even if this feature or this combination is not itself explicitly stated in the patent claims or exemplary embodiments.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A radiation-emitting semiconductor body, having a carrier substrate and a semiconductor layer stack which is suitable for producing electromagnetic radiation,
   wherein the semiconductor layer stack is arranged on the carrier substrate such that at least a part of a rear side, facing the carrier substrate, of the semiconductor layer stack covers a surface of a first region of the carrier substrate which faces the semiconductor layer stack, and that a surface of a connecting region of the carrier substrate which faces the semiconductor layer stack is free of the semiconductor layer stack,
   wherein a first subregion of the semiconductor layer stack projects beyond an edge of the carrier substrate such that it is arranged laterally alongside the carrier substrate, and
   wherein mutually facing surfaces of the semiconductor layer stack and of the carrier substrate have a same side length.

2. The radiation-emitting semiconductor body according to claim 1, wherein a contact layer is applied to the semiconductor body and at least partially covers a front side of the semiconductor layer stack, and covers at least a part of the connecting region of the carrier substrate.

3. The radiation-emitting semiconductor body according to claim 1, wherein a first electrically insulating layer is applied at least to a part of the connecting region of the carrier substrate.

4. The radiation-emitting semiconductor body according to claim 1, wherein a second electrically insulating layer is applied to at least one of side surfaces of the semiconductor layer stack and covers the at least one of the side surfaces at least in regions.

5. The radiation-emitting semiconductor body according to claim 1, wherein a first electrical connecting layer is arranged on the connecting region of the carrier substrate, on the contact layer, and is electrically conductively connected to the front side, facing away from the carrier substrate, of the semiconductor layer stack.

6. The radiation-emitting semiconductor body according to claim 1, wherein an electrical contact surface is arranged on a rear side of the first subregion of the semiconductor layer stack.

7. The radiation-emitting semiconductor body according to claim 1, wherein the semiconductor layer stack comprises a growth substrate.

8. The radiation-emitting semiconductor body according to claim 1, wherein a cavity which is bounded by the first subregion of the semiconductor layer stack, the carrier substrate and a planar support is at least partially filled with a filling material.

9. The radiation-emitting semiconductor body according to claim 1, wherein the semiconductor layer stack is based on one of an III-V compound semiconductor material and an II-VI compound semiconductor material, and wherein the III-V compound semiconductor material comprises one of a nitride compound semiconductor material and a phosphide compound semiconductor material.

10. The radiation-emitting semiconductor body according to claim 1, wherein the carrier substrate comprises a sapphire material.

11. The radiation-emitting semiconductor body according to claim 1, wherein one edge of the connecting region of the carrier substrate and an adjacent side surface of the semiconductor layer stack are offset with respect to one another by 50 µm or more in a plan view of a front side of the semiconductor layer stack.

12. The radiation-emitting semiconductor body according to claim 1, wherein a side surface of the first subregion of the semiconductor layer stack and an adjacent edge of the carrier substrate are offset by 50 µm or more in a plan view of a front side of the semiconductor layer stack.

13. The radiation-emitting semiconductor body according to claim 2, wherein the contact layer is at least partially permeable for the electromagnetic radiation produced by the semiconductor layer stack during operation.

14. The radiation emitting semiconductor body according to claim 13, wherein the contact layer has a transparent conductive oxide comprising indium tin oxide.

15. The radiation-emitting semiconductor body according to claim 5, wherein a second electrical connecting layer is arranged on the connecting region of the carrier substrate and is electrically conductively connected to the rear side, opposite the front side, of the semiconductor layer stack.

16. A radiation-emitting semiconductor body, having a carrier substrate and a semiconductor layer stack which is suitable for producing electromagnetic radiation, wherein the semiconductor layer stack is arranged on the carrier substrate such that at least a part of a rear side, facing the carrier substrate, of the semiconductor layer stack covers a surface of a first region of the carrier substrate which faces the semiconductor layer stack, and that a surface of a connecting region of the carrier substrate which faces the semiconductor layer stack is free of the semiconductor layer stack;
    wherein the carrier substrate consists of one material selected from the first group consisting of sapphire, GaN, and SiC or wherein the carrier substrate is selected from the second group consisting of a metal plate, a plastic panel and a glass pane; and
    wherein a first subregion of the semiconductor layer stack projects beyond an edge of the carrier substrate such that it is arranged laterally alongside the carrier substrate.

17. The radiation-emitting semiconductor body according to claim 16, wherein mutually facing surfaces of the semiconductor layer stack and of the carrier substrate have a same side length.

18. The radiation-emitting semiconductor body according to claim 16, further comprising a contact layer,
    wherein the contact layer is at least partially permeable for the electromagnetic radiation produced by the semiconductor layer stack during operation; and
    wherein the contact layer is applied to the semiconductor body and is drawn from a front side over at least one side face of the semiconductor body onto the connecting region of the carrier substrate, such that it covers at least a part of the front side of the semiconductor layer stack, at least a part of the at least one side surface of the semiconductor layer stack, and at least a part of the connecting region of the carrier substrate.

19. The radiation-emitting semiconductor body according to claim 16, further comprising a first electrical connecting layer and a second electrical connecting layer,
    wherein the first and second electrical connecting layers are arranged on the connecting region of the carrier substrate,
    wherein the first electrical connecting layer is electrically conductively connected to a front side of the semiconductor layer stack, and
    wherein the second electrical connecting layer is electrically conductively connected to the rear side, opposite the front side, of the semiconductor layer stack.

20. The radiation-emitting semiconductor body according to claim 16, further comprising a first electrical connecting layer and a second electrical connection layer,
    wherein the first electrical connecting layer is arranged on the connecting region of the carrier substrate and is electrically conductively connected to a front side of the semiconductor layer stack, and
    wherein the second electrical connecting layer is arranged on a rear side of the first subregion of the semiconductor layer stack.

21. The radiation-emitting semiconductor body according to claim 16, wherein a cavity, which is bounded by a rear surface of the first subregion of the semiconductor layer stack, a side face of the carrier substrate, and a planar support, is at least partially filled with a filling material.

22. A radiation-emitting semiconductor body, having a carrier substrate, a semiconductor layer stack which is suitable for producing electromagnetic radiation, and a contact layer,
    wherein the semiconductor layer stack is arranged on the carrier substrate such that at least a part of a rear side, facing the carrier substrate, of the semiconductor layer stack covers a surface of a first region of the carrier substrate which faces the semiconductor layer stack, and that a surface of a connecting region of the carrier substrate which faces the semiconductor layer stack is free of the semiconductor layer stack,
    wherein a first subregion of the semiconductor layer stack projects beyond an edge of the carrier substrate such that it is arranged laterally alongside the carrier substrate,
    wherein the contact layer is at least partially permeable for the electromagnetic radiation produced by the semiconductor layer stack during operation, and
    wherein the contact layer is applied to the semiconductor body and is drawn from a front side over at least one side face of the semiconductor body onto the connecting region of the carrier substrate, such that it covers at least a part of the front side of the semiconductor layer stack, at least a part of at least one side surface of the semiconductor layer stack, and at least a part of the connecting region of the carrier substrate.

23. The radiation-emitting semiconductor body according to claim 22, wherein mutually facing surfaces of the semiconductor layer stack and of the carrier substrate have a same side length.

24. The radiation-emitting semiconductor body according to claim 22, further comprising
a first electrical connecting layer and a second electrical connecting layer,
wherein the first and second electrical connecting layers are arranged on the connecting region of the carrier substrate,
wherein the first electrical connecting layer is arranged on the contact layer such that it is electrically conductively connected to a front side of the semiconductor layer stack, and
wherein the second electrical connecting layer is electrically conductively connected to the rear side, opposite the front side, of the semiconductor layer stack.

25. The radiation-emitting semiconductor body according to claim 22, further comprising
a first electrical connecting layer and a second electrical connecting layer,
wherein the first electrical connecting layer is arranged on the contact layer on the connecting region of the carrier substrate such that it is electrically conductively connected to a front side of the semiconductor layer stack, and
wherein the second electrical connecting layer is arranged on a rear side of the first subregion of the semiconductor layer stack.

26. The radiation-emitting semiconductor body according to claim 22, wherein a cavity, which is bounded by a rear surface of the first subregion of the semiconductor layer stack, a side face of the carrier substrate, and a planar support, is at least partially filled with a filling material.

* * * * *